(12) United States Patent
Gochis

(10) Patent No.: US 9,471,721 B1
(45) Date of Patent: Oct. 18, 2016

(54) PROCESS FOR DYNAMIC DESIGN OF PILE FOUNDATION SYSTEMS USING TUNABLE PILE MEMBERS CAPABLE OF ABSORBING VIBRATIONS

(71) Applicant: Bernard J. Gochis, Westminster, CO (US)

(72) Inventor: Bernard J. Gochis, Westminster, CO (US)

( * ) Notice: Subject to any disclaimer, the term of this patent is extended or adjusted under 35 U.S.C. 154(b) by 0 days.

(21) Appl. No.: 14/730,278

(22) Filed: Jun. 4, 2015

Related U.S. Application Data

(62) Division of application No. 13/744,178, filed on Jan. 17, 2013.

(60) Provisional application No. 61/588,156, filed on Jan. 18, 2012.

(51) Int. Cl.
*E02D 5/52* (2006.01)
*G06F 17/50* (2006.01)
*E02D 1/02* (2006.01)
*E02D 3/12* (2006.01)

(52) U.S. Cl.
CPC ........... *G06F 17/5004* (2013.01); *E02D 1/022* (2013.01); *E02D 3/12* (2013.01)

(58) Field of Classification Search
CPC .................................. E02D 5/52; E02D 5/523
USPC ............. 405/229, 250–252; 52/167.3, 167.4, 52/167.6–167.9
See application file for complete search history.

(56) References Cited

U.S. PATENT DOCUMENTS 5,813,800 A 9/1998 Doleshal
8,235,346 B2 8/2012 Bakos

FOREIGN PATENT DOCUMENTS

JP 01207544 A 8/1989

OTHER PUBLICATIONS

English Abstract of JP 01207544 A, Aug. 21, 1989, 2 pp.
Certification of accuracy of English translation of JP Patent Application No. H1-207544, May 4, 2016, 1 pp.
English translation of JP Patent Application No. H1-207544.

*Primary Examiner* — Sunil Singh
(74) *Attorney, Agent, or Firm* — James A. Sheridan; Sheirdan Law, LLC

(57) ABSTRACT

There is disclosed a process for making a foundation system for a platform. In an embodiment, the process includes obtaining design data relating to load and soil characteristics; performing modal tests on a pile member installed in soil to determine natural frequency of the pile member; performing vibration tests on a pile member to determine stiffness; forming a model of using data obtained; testing, in silico, how the model responds to frequencies in a range of the equipment; adjusting, in silico, the model to satisfy design criteria; forming, in silico, a plan of a foundation system based on the adjusted model; installing the foundation system based on the plan; performing vibration tests on the installed foundation system, and measuring vibration levels; and adjusting the foundation system to avoid resonance at a natural frequency by one of stiffen vibrations or dampen vibrations. Other embodiments are also disclosed.

6 Claims, 31 Drawing Sheets

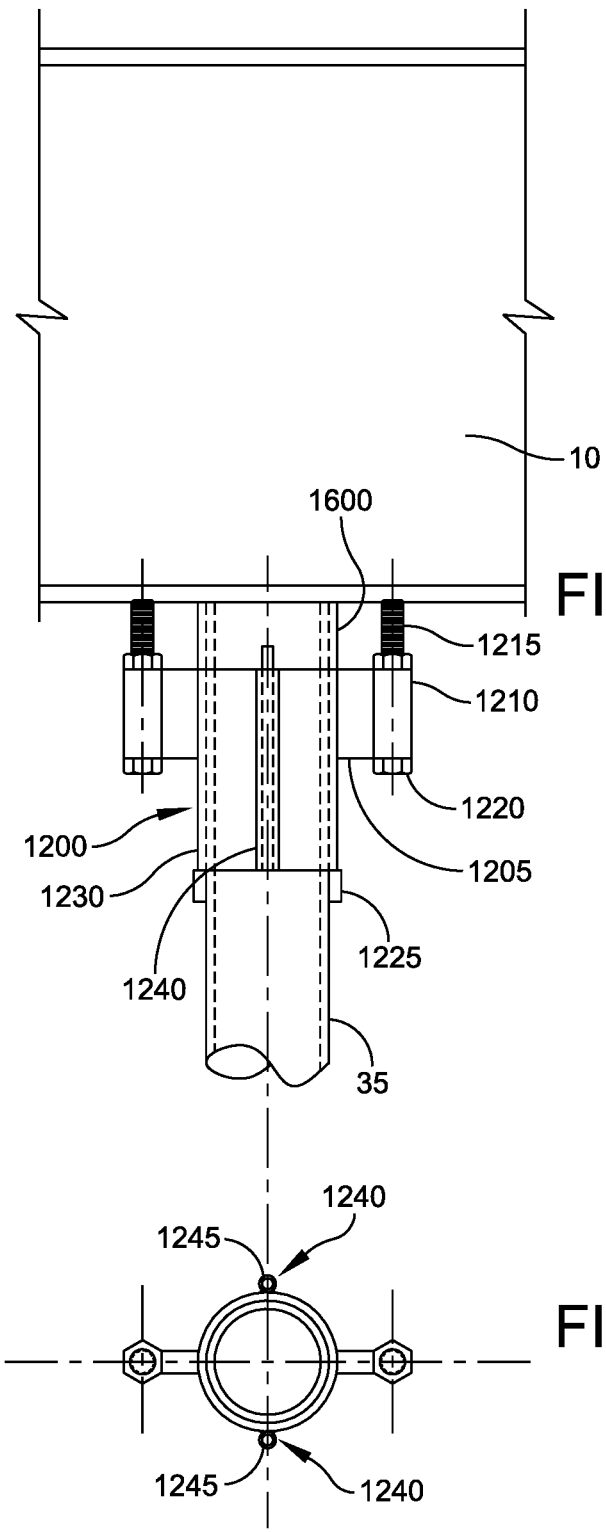

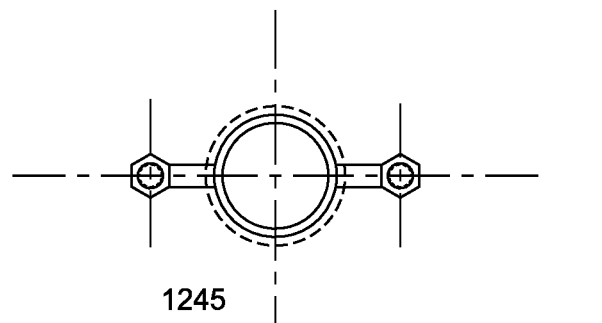
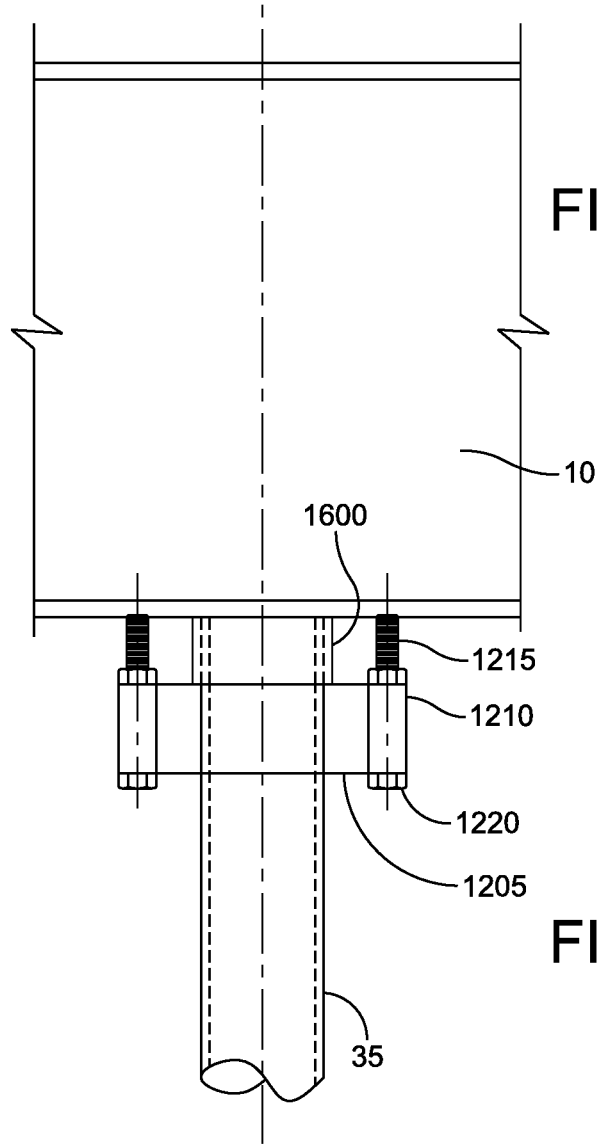
FIG. 14(a)
FIG. 14(b)

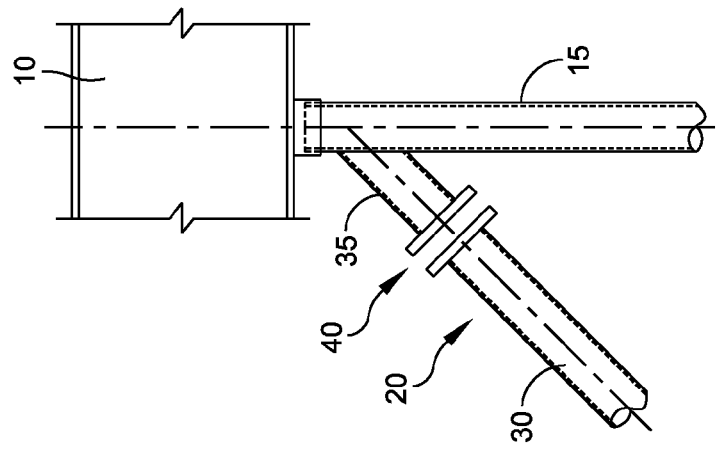
FIG. 22(c) BATTERED PILE DISCONNECTED
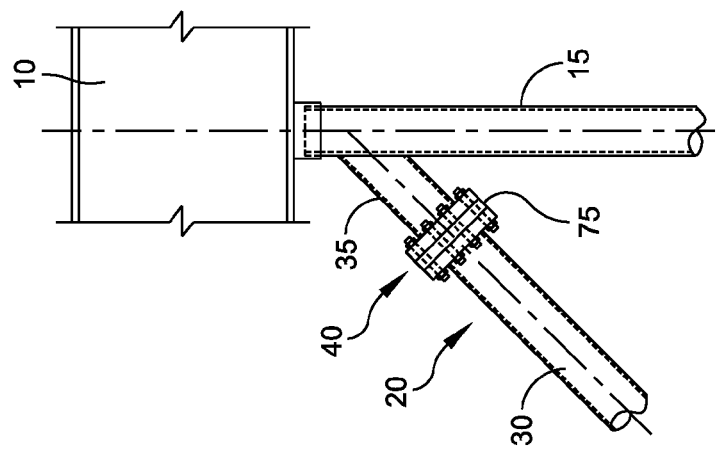
FIG. 22(b) CONNECTED w/ DAMPING MATERIAL REMOVED & CONNECTED WITH SOLID PLATE INSTALLED
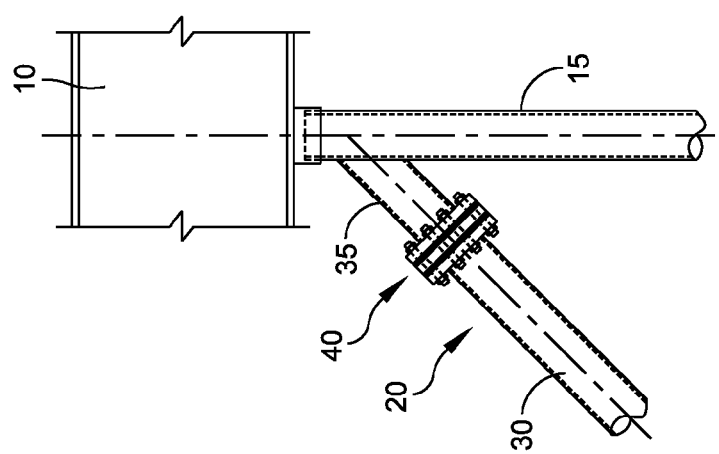
FIG. 22(a) CONNECTED w/ DAMPING MATERIAL INSTALLED

PROCESS FOR DYNAMIC DESIGN OF PILE FOUNDATION SYSTEMS USING TUNABLE PILE MEMBERS CAPABLE OF ABSORBING VIBRATIONS

REFERENCE TO PENDING PRIOR PATENT APPLICATION

This application is a division of pending prior U.S. patent application Ser. No. 13/744,178, filed Jan. 17, 2013 by Bernard J. Gochis for PROCESS FOR DYNAMIC DESIGN OF PILE FOUNDATION SYSTEMS USING TUNABLE PILE MEMBERS CAPABLE OF ABSORBING VIBRATIONS, which claims the benefit under 35 U.S.C. 119(e) of U.S. Provisional Patent Application Ser. No. 61/588,156, filed Jan. 18, 2012 by Bernard J. Gochis for "PROCESS FOR DYNAMIC DESIGN OF PILE FOUNDATION SYSTEMS USING TUNABLE PILE MEMBERS CAPABLE OF ABSORBING VIBRATIONS," which patent application is hereby incorporated herein by reference.

BACKGROUND

Conventionally, a pile foundation system generally includes a skid or platform connected with (i.e., welded to) a plurality of pile members that have been driven into the ground. This type of foundation system works well with traditional loads that rest on the skid or platform, such as building structures. One benefit to pile foundation systems is that they can be installed without the need for concrete foundations.

As recognized by the present inventor, where a structure or load is to be supported by a pile foundation system and the structure or load will vibrate or oscillate significantly when in place on the platform (i.e., natural gas compressors which reciprocate in a manner that causes vibration), conventional pile foundation systems may also vibrate.

Accordingly, as recognized by the present inventor, what is needed are pile members that are capable of absorbing vibration, and a process for dynamically designing a pile foundation system using tunable pile members that are capable of absorbing vibration.

SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

In an embodiment, there is provided a foundation system for supporting equipment on a platform, the foundation system capable of harmonic resonation at a natural frequency due to movement of the equipment on the platform, the foundation system comprising one or more vertical pile members, each vertical pile member having a first end adapted to be driven into the ground and a second end adapted to be connected with a bottom portion of the skid platform; and one or more tunable pile members, each tunable pile member having a lower portion adapted to be driven into the ground and an upper portion adapted to be connected directly or indirectly with the skid platform, each tunable pile member adapted to receive an insert member between the upper and lower portions, so that the stiffness of the tunable pile member can be adjusted.

In another embodiment, there is provided a process for making a foundation system for a platform, the foundation system capable of harmonic resonation at a natural frequency due to movement of the equipment on the platform, including the steps of a) obtaining design data relating to the load and the soil characteristics; b) performing one or more modal tests on a pile member installed in the soil to determine the natural frequency of the pile member; c) performing one or more vibration tests on a pile member installed in the soil to determine the stiffness of the pile member; d) forming a model the foundation system using the data obtained in steps a)-c), the model including a skid platform, vertical pile members, and adjustable pile members; e) testing, in silico, how the model responds to frequencies in the range of the reciprocating equipment; f) adjusting, in silico, the model to satisfy design criteria; g) forming, in silico, a plan of a foundation system based on the adjusted model; h) installing the foundation system based on the plan; i) performing vibration tests on the installed foundation system, and measuring vibration levels; and j) adjusting the foundation system to avoid resonance at a natural frequency by one of stiffen vibrations and dampen vibrations.

In yet another embodiment, there is provided a process for making a foundation system for a platform, the foundation system capable of harmonic resonation at a natural frequency due to movement of the equipment on the platform, including the steps of a) obtaining design data relating to the load and the soil characteristics; b) performing one or more modal tests on a pile member installed in the soil to determine the natural frequency of the pile member; c) performing one or more vibration tests on a pile member installed in the soil to determine the stiffness of the pile member; d) forming a model the foundation system using the determined natural frequency of the pile member data obtained in steps a)-c), the model including a skid platform, vertical pile members, and adjustable pile members; e) testing, in silico, of how the model responds to frequencies in the range of the reciprocating equipment; f) adjusting, in silico, the model to satisfy design criteria; h) forming, in silico, a plan of a foundation system based on the adjusted model; i) installing the foundation system based on the plan; j) performing vibration tests on the installed foundation system, and measuring vibration levels; and k) adjusting the foundation system to avoid resonance at a natural frequency by one of stiffen vibrations and dampen vibrations.

Other embodiments are also disclosed.

In light of the above and according to some embodiments, disclosed herein are various embodiments of pile foundation systems using inventive tunable pile members that are capable of selectively absorbing vibration. Also disclosed herein are processes for dynamically designing pile foundation systems using tunable pile members. Also disclosed herein are jack bolts that can be connected to a pile member to engage a portion of a platform in order to provide for leveling of the platform, and shim tubes which may be used for connecting pile members to portions of a platform.

In one example, a process for dynamically designing a pile foundation system can provide the required stiffness so as not to excite (and thereby prevent) the natural frequency of the foundation system from harmonically resonating. As disclosed herein, this process can include preliminary on-site vibration testing that provides pile stiffness values; modal testing (i.e., bump tests) to determine the frequency of piles; static testing to verify soil density; skid/platform modeling using Finite Element Analysis (FEA) to determine the natural frequency of the skid.

In one example, field and pile results are input into the FEA model which is simulated on a computer to determine if a harmonic resonance would occur within the operating speed range of the heavy reciprocating equipment that is to be supported by the foundation system. If harmonic resonance would occur, piles (including tunable pile members) can be added, removed or relocated until the simulation results are acceptable in terms of minimizing vibration/resonance.

Once the model simulation is confirmed as being acceptable, the pile layout plans are created and, depending on the layout design plans, the plans may use vertical piles, battered piles, any or all of which may be tunable piles. The piles are installed into the ground according to the pile layout plans. Once the piles are installed into the ground and their position, height, level and any other parameters are confirmed, the skid is lowered onto the piles, the skid foundation is leveled, and the piles are welded to the skid.

If needed, shim tubes (described below) can be used to bridge any gaps between the tops of any piles and the bottom of the skid. In an embodiment, the shim is positioned around the outer diameter of the top of the pile and welded to both the pile and the bottom of the skid.

Also, if needed, jack bolts can be attached to the top portions of pile members. Jack bolts may be adjusted to raise the level of the skid at the location of the pile, in order to help level the foundation if needed. Once the skid has been leveled and connected (i.e., welded) with the pile members, before startup of the equipment, the skid is tested with shakers and sensors that are placed on the skid, to confirm there are no unacceptable levels of harmonic resonance or vibration within the operating speed of the equipment. If there is an unacceptable level of harmonic resonance or vibration, one or more piles are adjusted. For instance, one or more tunable pile members can be dampened, one or more tunable pile members can be stiffened, or one or more tunable pile members can be dampened while one or more tunable pile members can be stiffened, which can help reduce vibration of the foundation. Once the vibration testing confirms that there are no unacceptable levels of harmonic resonance or vibration within the operating speed of the equipment, the equipment on the skid is turned on. Additional fine-tuning adjustments to the tunable piles can still be made if desired.

Additional objects, advantages and novel features of the technology will be set forth in part in the description which follows, and in part will become more apparent to those skilled in the art upon examination of the following, or may be learned from practice of the technology.

BRIEF DESCRIPTION OF THE DRAWINGS

Non-limiting and non-exhaustive embodiments of the present invention, including the preferred embodiment, are described with reference to the following figures, wherein like reference numerals refer to like parts throughout the various views unless otherwise specified. Illustrative embodiments of the invention are illustrated in the drawings, in which:

FIGS. 12(a)-12(b), 13(a)-13(b), and 14(a)-14(b) illustrate examples of jack bolts for connecting a pile to a portion of a platform in order to provide for leveling of the platform, in accordance with one embodiment.

FIGS. 22(a)-22(c) illustrate an example of a tunable pile member in three different configurations, in accordance with one embodiment.

DETAILED DESCRIPTION

Embodiments are described more fully below in sufficient detail to enable those skilled in the art to practice the system and method. However, embodiments may be implemented in many different forms and should not be construed as being limited to the embodiments set forth herein. The following detailed description is, therefore, not to be taken in a limiting sense.

Disclosed herein are various embodiments of pile foundation systems using tunable pile members that are capable of selectively absorbing vibration, and processes for dynamically designing pile foundation systems using tunable pile members. Also disclosed herein are jack bolts that can be connected to pile members for engaging a portion of a skid platform in order to provide for leveling of the platform, and shim tubes which may be used for connecting (i.e., welding) pile members to portions of a platform.

Pile Foundation Systems Using Tunable Pile Members

Figure 1:
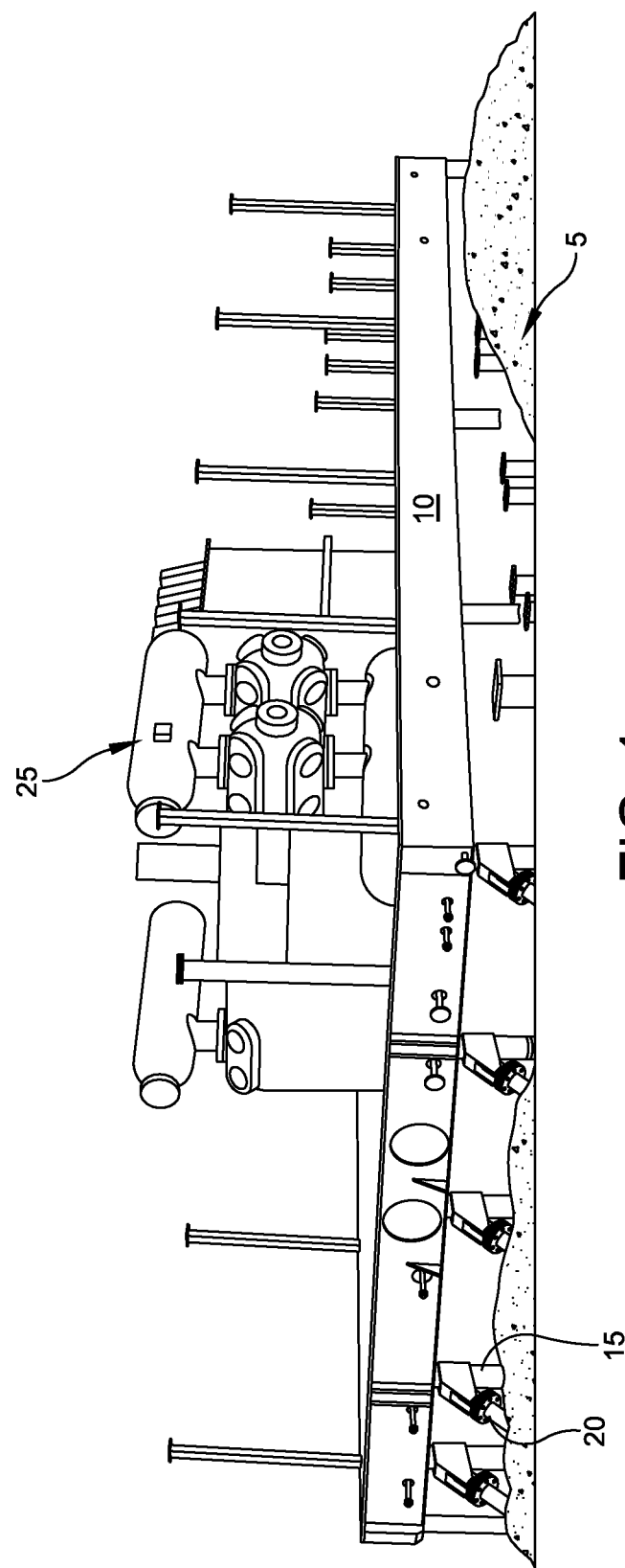
FIGS. 1 and 2 illustrate examples of foundation platforms with vertical piles, angled piles, and tunable piles, in accordance with various embodiments.
Figure 2:
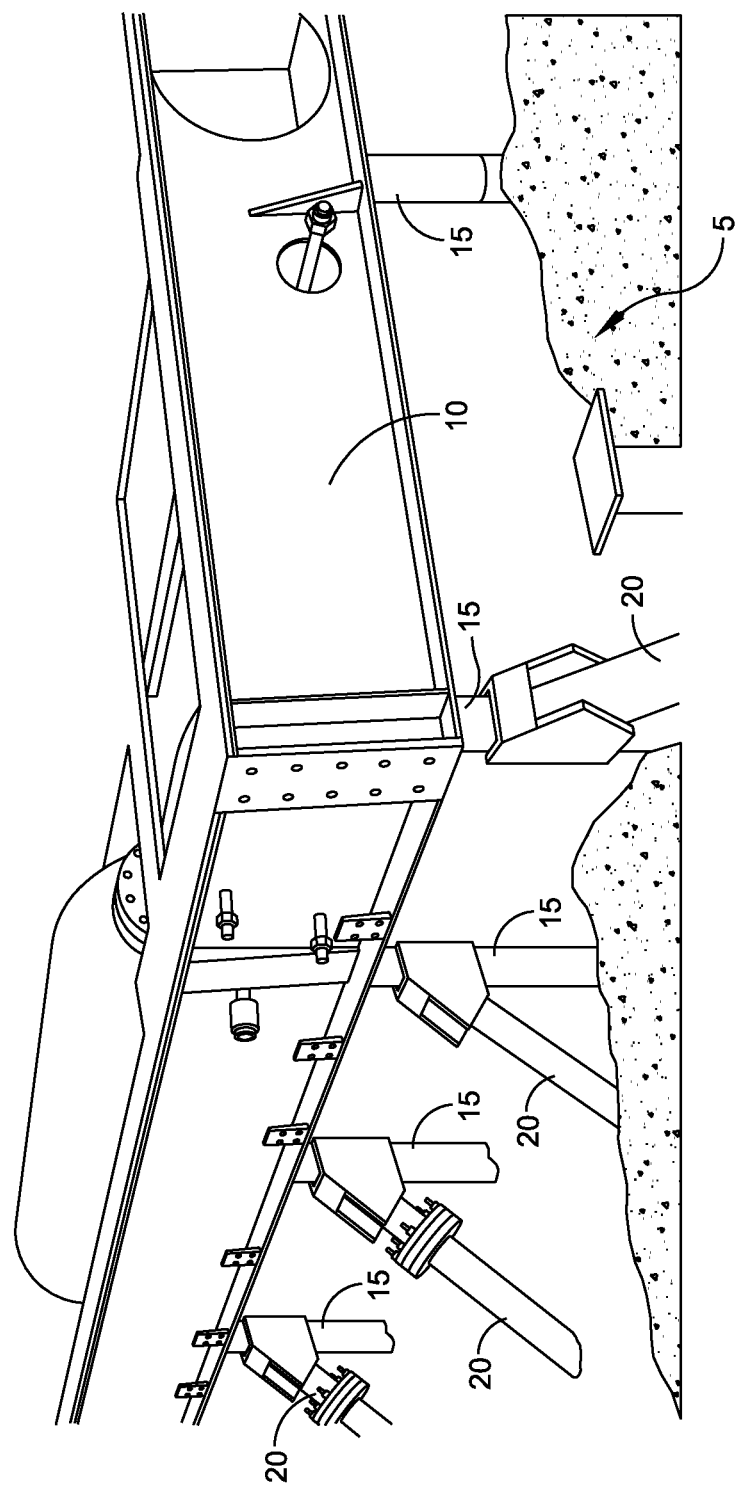
Figure 3:
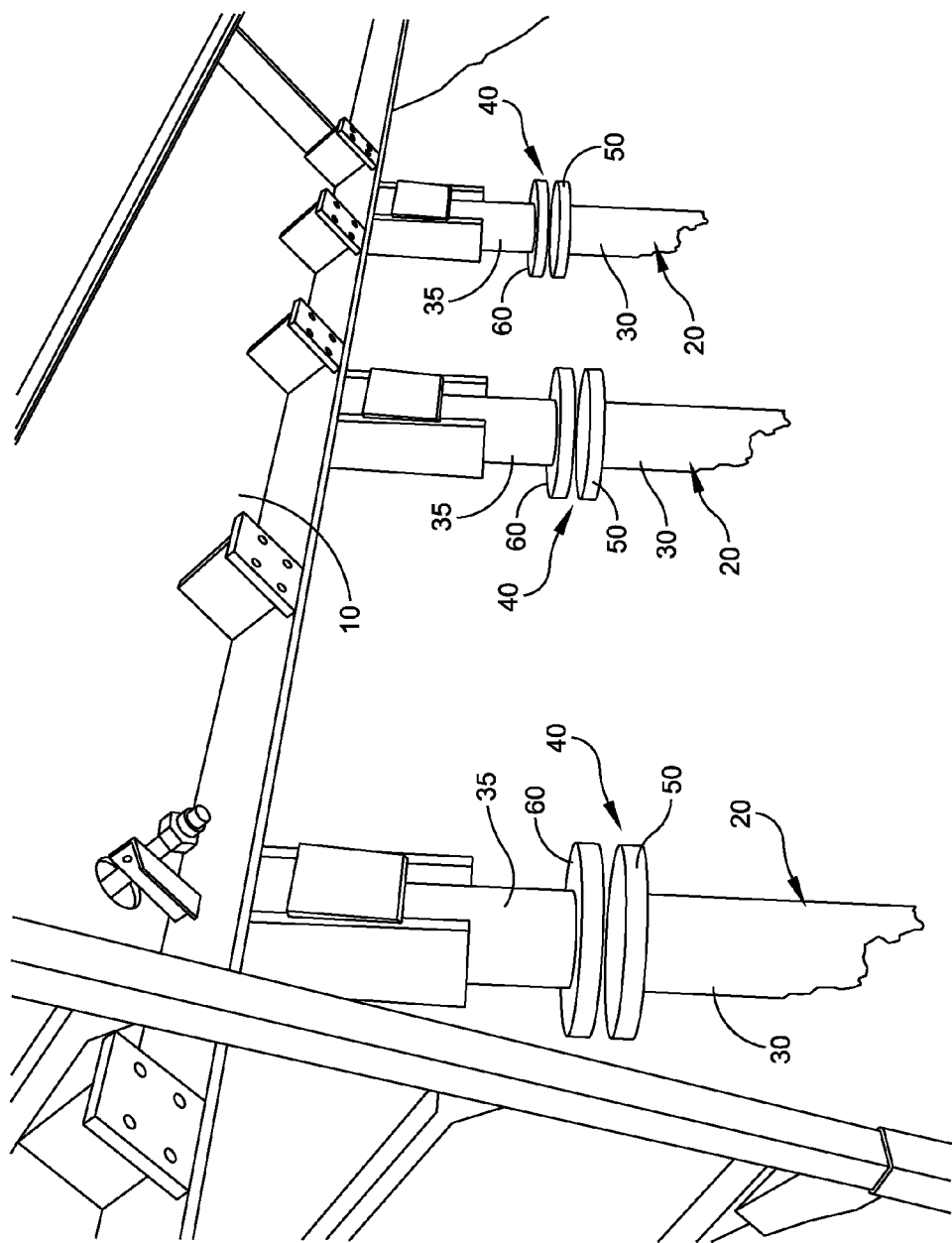
FIG. 3 illustrates an example of tunable battered piles in an open connection configuration, wherein no inserts have been installed.

Referring to FIGS. 1-2, examples of foundation systems 5 are shown including foundation platforms 10 (also referred to as skids 10) connected with and supported by vertical pile members 15, angled pile members 20, and tunable pile members 15 or 20 that have been screwed or driven into the ground, in accordance with embodiments. The skid platform 10 is adapted to support a variety of loads, such as but not limited to structures or equipment 25 (i.e., reciprocating loads, natural gas processing equipment, heavy equipment) or other items.

Figure 17:
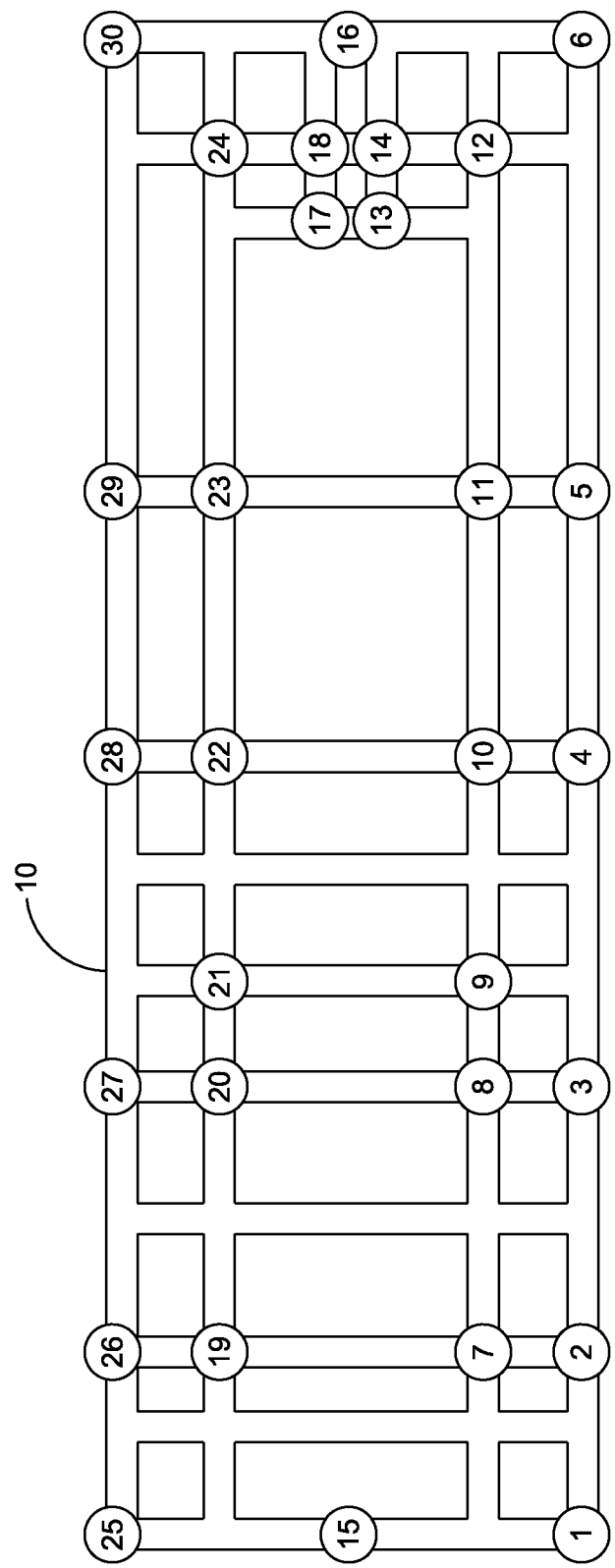
FIG. 17 illustrates an example of support locations on the bottom side of an example of a skid where piles can be connected, in accordance with an embodiment.

The skid platform 10 is connected (i.e., welded or otherwise attached) at multiple locations to a plurality of vertical piles 15 and angled piles 20 (referred to herein also as "battered piles 20") that have been driven into the ground. FIG. 17 shows an example of different locations where piles can be connected to a skid 10. As described herein, one or more tunable piles 15 or 20 are used to support the platform 10 and to reduce or dampen the oscillation or vibration of the skid platform 10 when the load 25 vibrates or oscillates.

As shown in FIGS. 3-6 and 22, in accordance with an embodiment, a tunable pile member 15 includes a lower pile member 30, an upper pile member 35, and a tunable insert portion 40 positioned between the upper pile member 35 and the lower pile member 30. The lower pile member 30 has one end 45 configured to be driven into the ground and at the opposing free end includes a flange 50 or bearing surface 50 which is adapted to securely receive the tunable insert portion 40.

The upper pile member 35 at one end is adapted to be connected (i.e., welded or otherwise attached) to the skid platform 10 (directly or indirectly via a connection 55 to a vertical pile member 15 that is connected or configured for connection to the platform 10), and at the opposing free end includes a flange 60 or bearing surface 60 which is adapted to be securely receive the tunable insert portion 40.

Both flanges 55, 60 may include a plurality of corresponding and aligned openings 65 (FIG. 8), through which bolts 70 (FIGS. 4-8) can be passed to secure the tunable insert portion therein.

The tunable insert portion 40 is positioned between the lower flange 50 of the lower pile member 30 and the upper flange 60 of the upper pile member 35. The tunable insert portion 40 is adapted to define the dampening characteristic of the tunable pile member 20. In one example, and with reference to FIG. 3, the tunable pile member 20 may be used in an open configuration wherein no insert portion 40 is positioned between the upper pile member 35 and lower pile member 45. This open configuration offers no dampening for the skid platform 10 from the tunable pile member.

Figure 4:
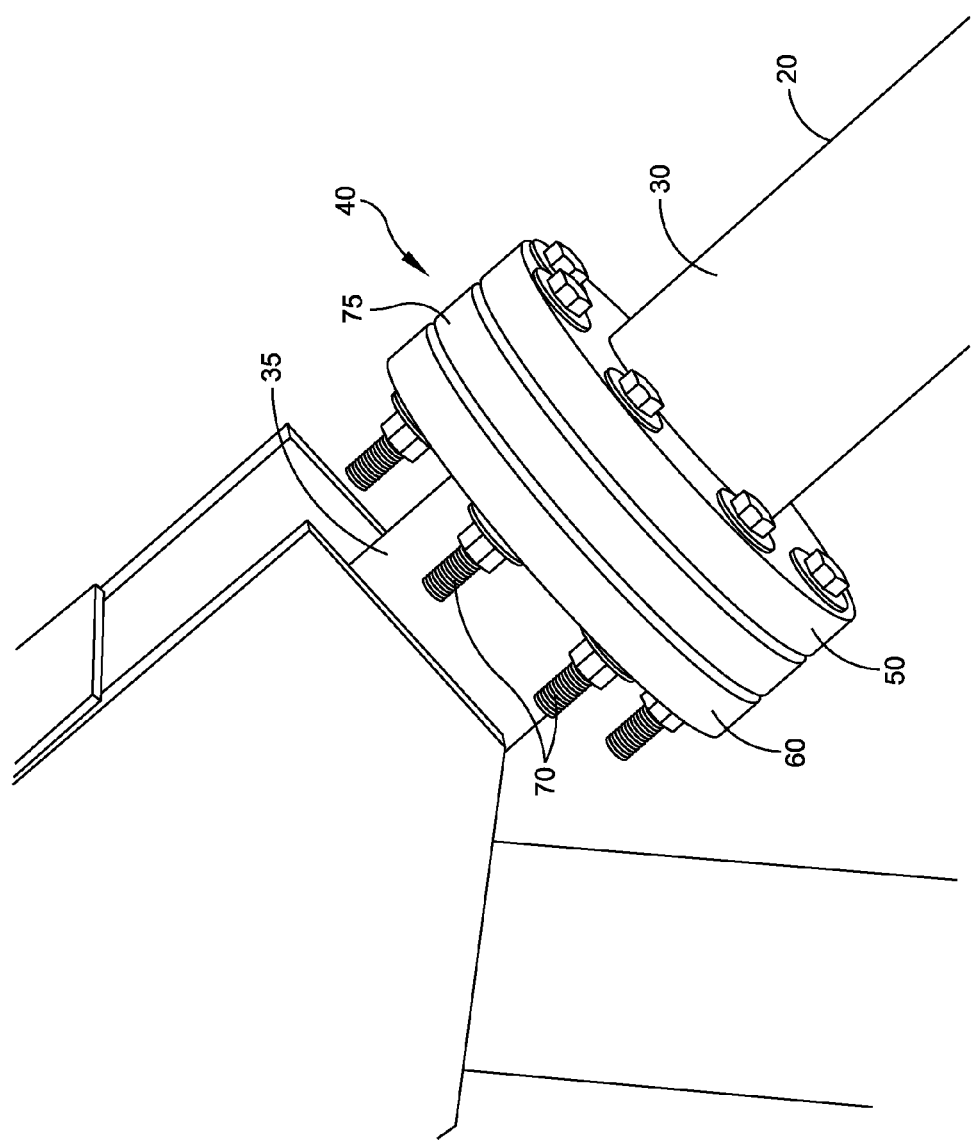
FIGS. 4 and 5 illustrate examples of tunable piles, wherein a solid connection is formed using a steel disc insert, in accordance with one embodiment.
Figure 5:
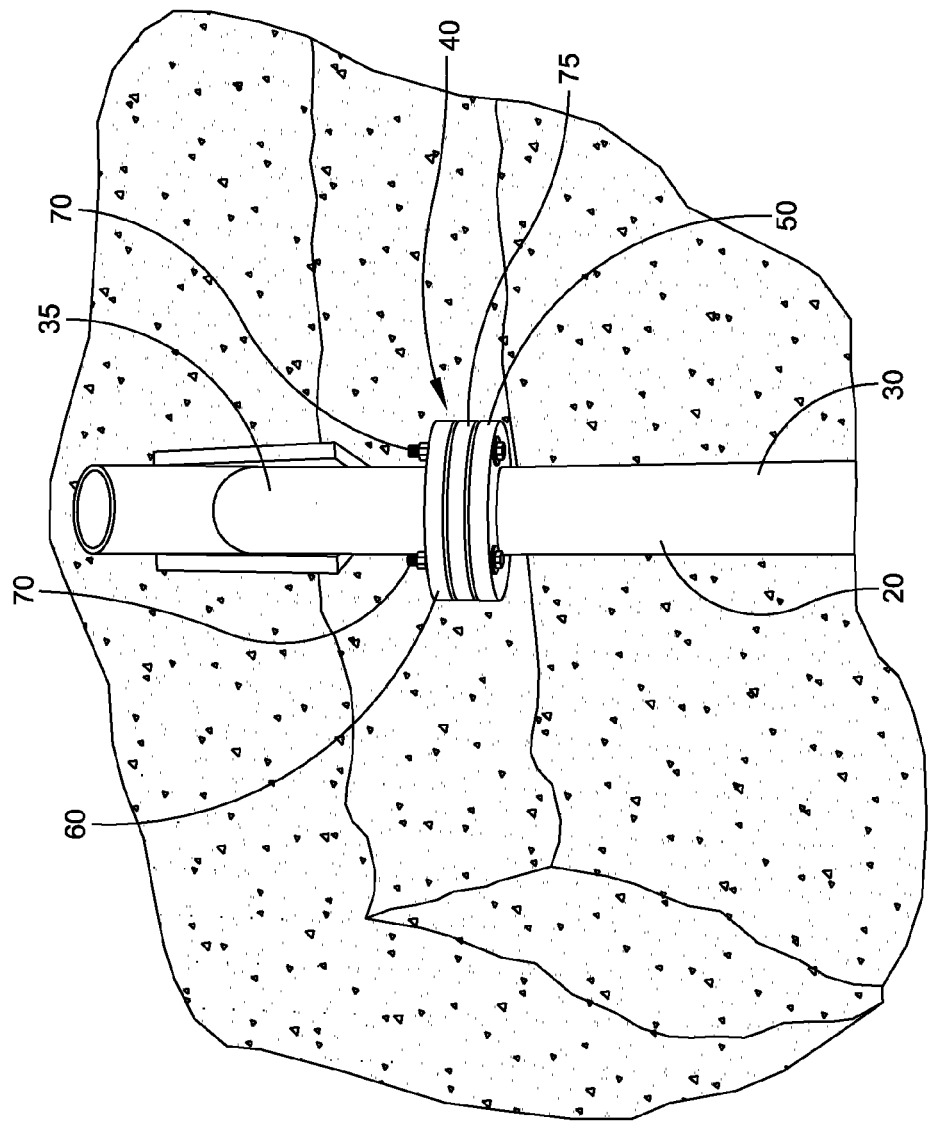

In another exemplary embodiment, and with reference to FIGS. 4 and 5, a tunable insert portion 40 may include a rigid steel disc 75 that is inserted between the upper pile member 35 and lower pile member 45 to form a rigid/solid connection. The steel disc 75 may include a plurality of openings through which bolts 70 can be passed to secure the disc to the upper and lower flanges of upper and lower pile members. This configuration offers dampening for the platform in the sense that vibrations from the platform are transferred along the tunable pile member to the ground.

Figure 6:
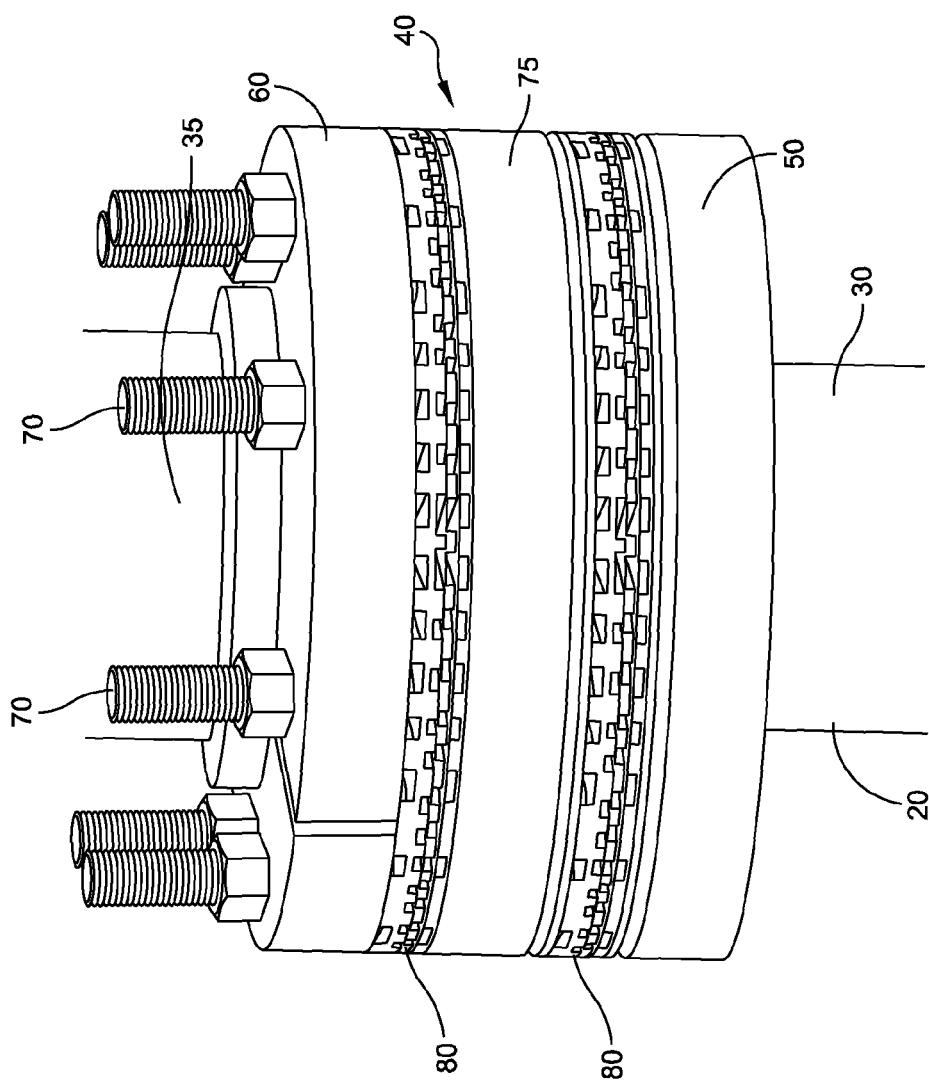
FIG. 6 illustrates an example of a tunable pile having a dampened insert, in accordance with one embodiment.

In another exemplary embodiment, and with reference to FIG. 6, a tunable insert portion 40 may include a dampening material 80 or a vibration absorbing material 80, such as, but not limited to, Korfund. The type of material and characteristics of the material will depend upon the particular implementation, including factors such as the amount of vibration absorption that is desired by the tunable pile member, and the frequency and magnitude of vibrations that occur on the platform.

In the exemplary embodiment of FIG. 6, the tunable insert portion 20 includes a first lower absorbing layer 80 (which can be made of a material such as Korfund or other material), a steel disc layer 75, and a second upper absorbing layer 80 (which can be made of a material such as Korfund or other material)—all positioned between the lower flange 50 of the lower pile member 30 and the upper flange 60 of the upper pile member 35. The absorbing layers 80 and the steel disc layer 75 may include a plurality of openings 65 through which bolts 70 can be passed to secure the layers to the upper flange 60 and lower flange 50 of upper pile member 35 and lower pile member 30. This configuration offers dampening for the platform 10 in the sense that vibrations from the platform 10 are transferred along the tunable pile member 20 and dampened or absorbed by the tunable insert portion 40.

In another exemplary embodiment of a tunable pile, instead of an angled pile member 20, a tunable pile member (not shown) can be formed in a vertical orientation if desired. For instance, a tunable pile can be made using a vertical pile member driven into the ground, and a tunable insert portion (i.e., a dampening material insert, a steel disc insert, or an open configuration) can be attached between the top of the pile and the bottom of the platform, in one example. In other embodiments, concrete may be used as an indirect connection between portions of the tunable pile, between the tunable pile and the platform, or in other configurations.

Figure 7:
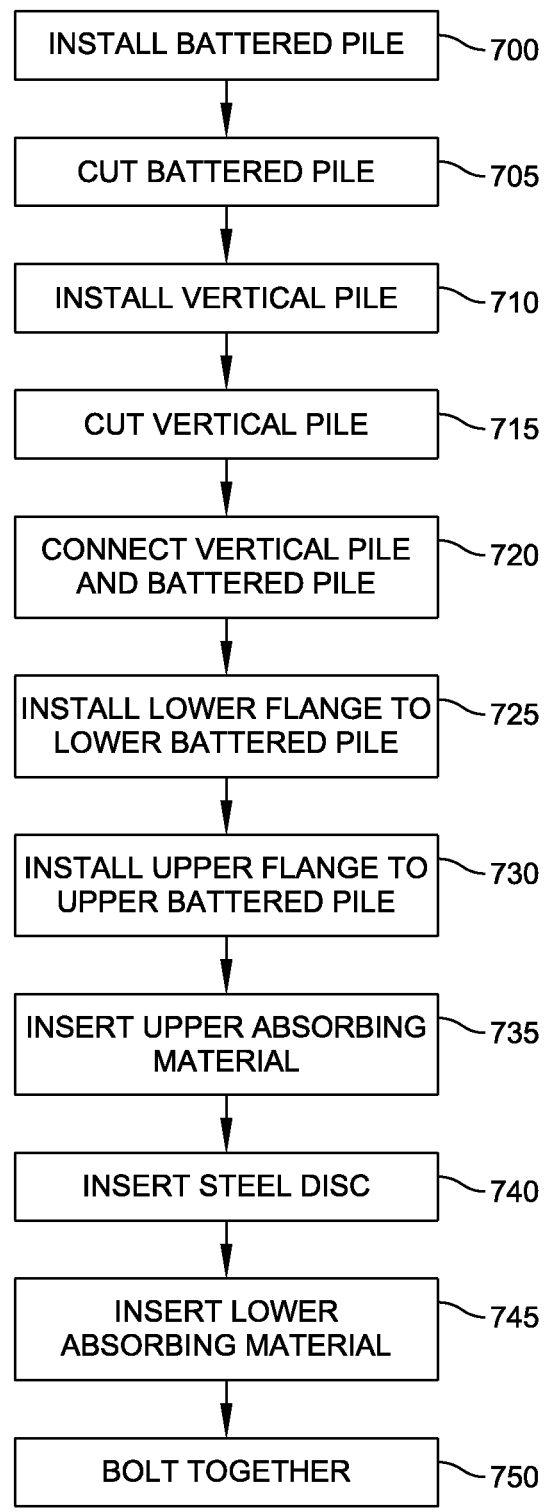
FIGS. 7 and 8(a)-8(c) illustrate examples of processes for installing a tunable pile for use in a foundation, in accordance with one embodiment.
Figure 8A:
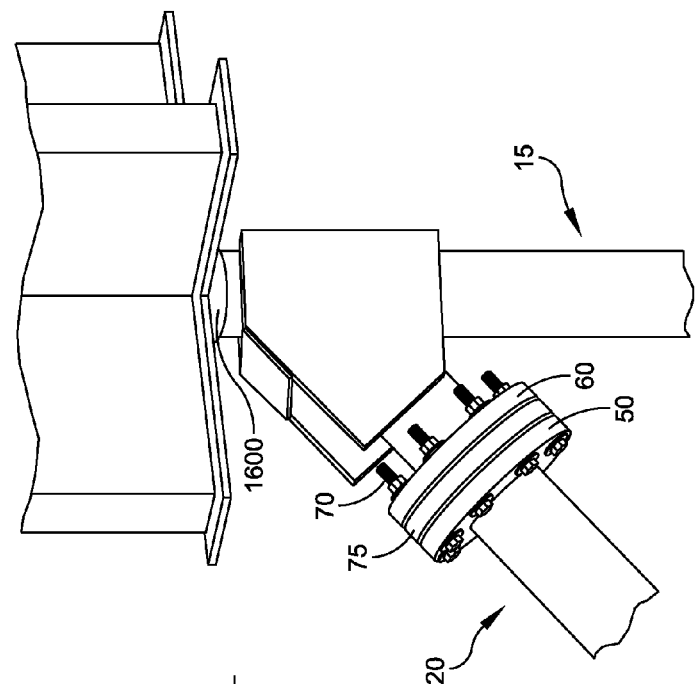
Figure 8B:
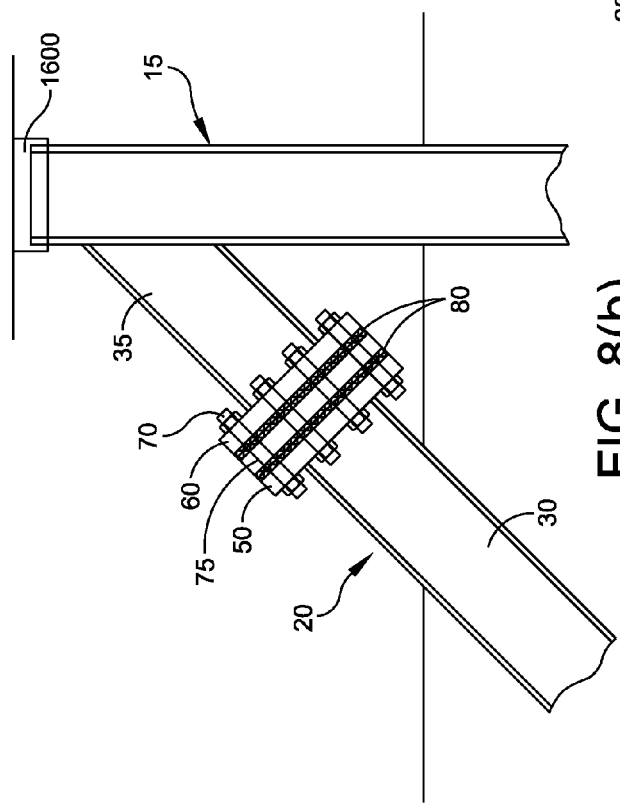
Figure 8C:
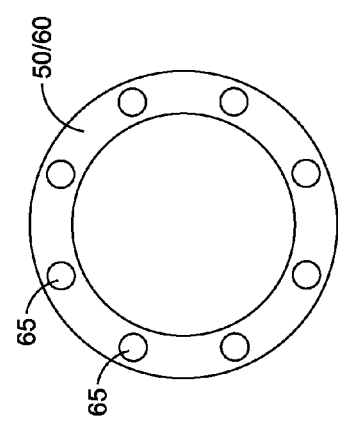

FIGS. 7-8 illustrate examples of processes for installing a tunable pile for use in a foundation, in accordance with one embodiment of the present invention.

At operation 700, an angled pile member (also referred to herein as a "battered pile") is installed and driven into the ground, and in one example, at an angle relative to the ground. At operation 705, the battered pile is cut at a line above ground, thereby forming a lower portion and an upper portion of the battered pile. At operation 710, a vertical pile is installed and driven into the ground proximate the battered pile. At operation 715, cut vertical pile, and at operation 720, the upper free portion of the battered pile is installed to the vertical pile. Plates (i.e., side plates) can be installed to both the upper portion of the battered pile and to the vertical pile, in order to keep the upper portion positioned and connected securely to the vertical pile.

At operation 725, a lower flange is installed to the lower portion of the battered pile. In one exemplary embodiment, the lower flange has a plurality of openings for receiving bolts. At operation 730, an upper flange (which in one exemplary embodiment has a plurality of openings for receiving bolts) is positioned and installed relative to the upper pile portion of the battered pile.

At operation 735, an upper absorbing material (i.e., Korfund ring) is positioned relative to the upper flange. At operation 740, the upper flange is installed onto the upper portion of the battered pile. At operation 745, a lower absorbing material (i.e., Korfund ring) is positioned relative to the lower flange of the lower portion of the battered pile. As shown in FIGS. 4, 5, and 8, a steel disc may be positioned between the upper absorbing material and lower absorbing material if desired. At operation 750, the upper and lower flanges, along with the upper and lower absorbing materials and steel disc, are bolted together using a plurality of bolts, which thereby connects and secures the lower portion and upper portion of the battered pile with the tunable insert portion therebetween.

Figures 9A, 9B:
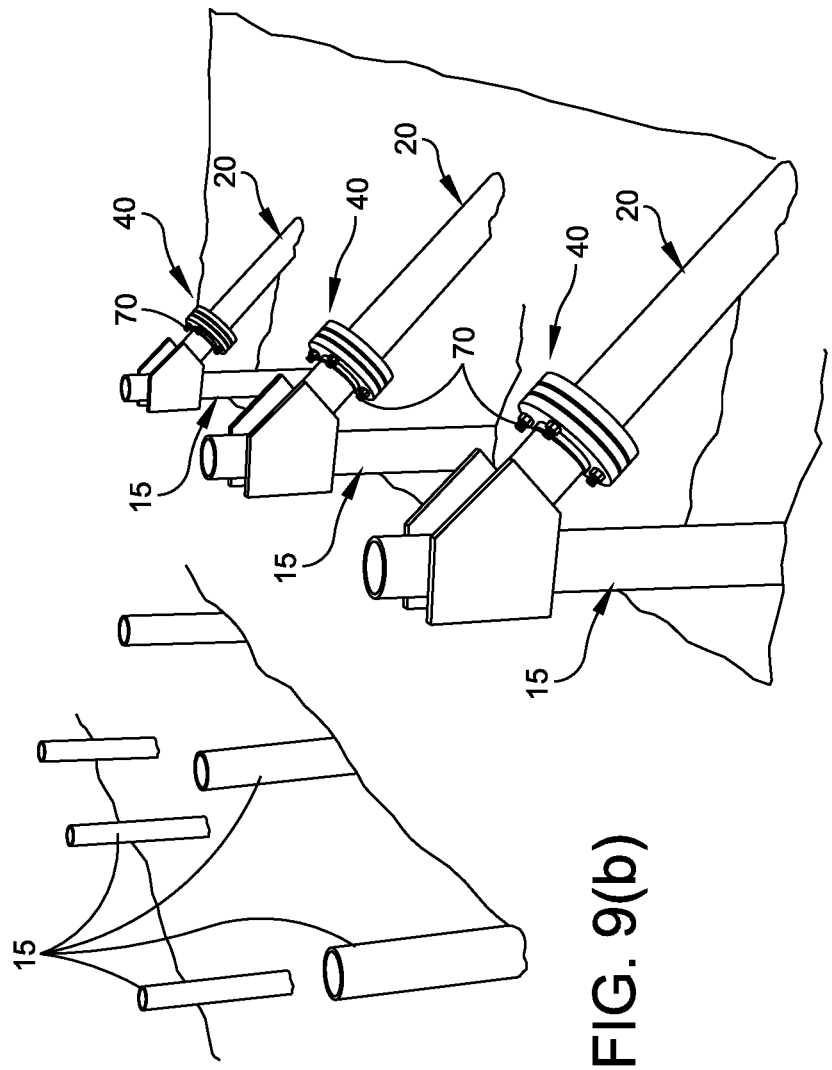
FIGS. 9(a) and 9(b) illustrate an example of tunable piles, in accordance with an embodiment.

FIG. 9 illustrates examples of tunable piles 20 having been installed, in this case with metal discs 70 installed as the tunable insert portion 40.

Hence, it can be seen that a foundation can be formed with one or more tunable pile members that can be selectively used to reduce or mitigate the amount of vibration along the skid of the foundation. Moreover, through the use of tunable piles, the foundation system is adjustable for vertical and horizontal stiffness whereas traditional systems (i.e., concrete foundations) are not generally adjustable for horizontal stiffness.

Dynamic Design Processes

Figure 10:
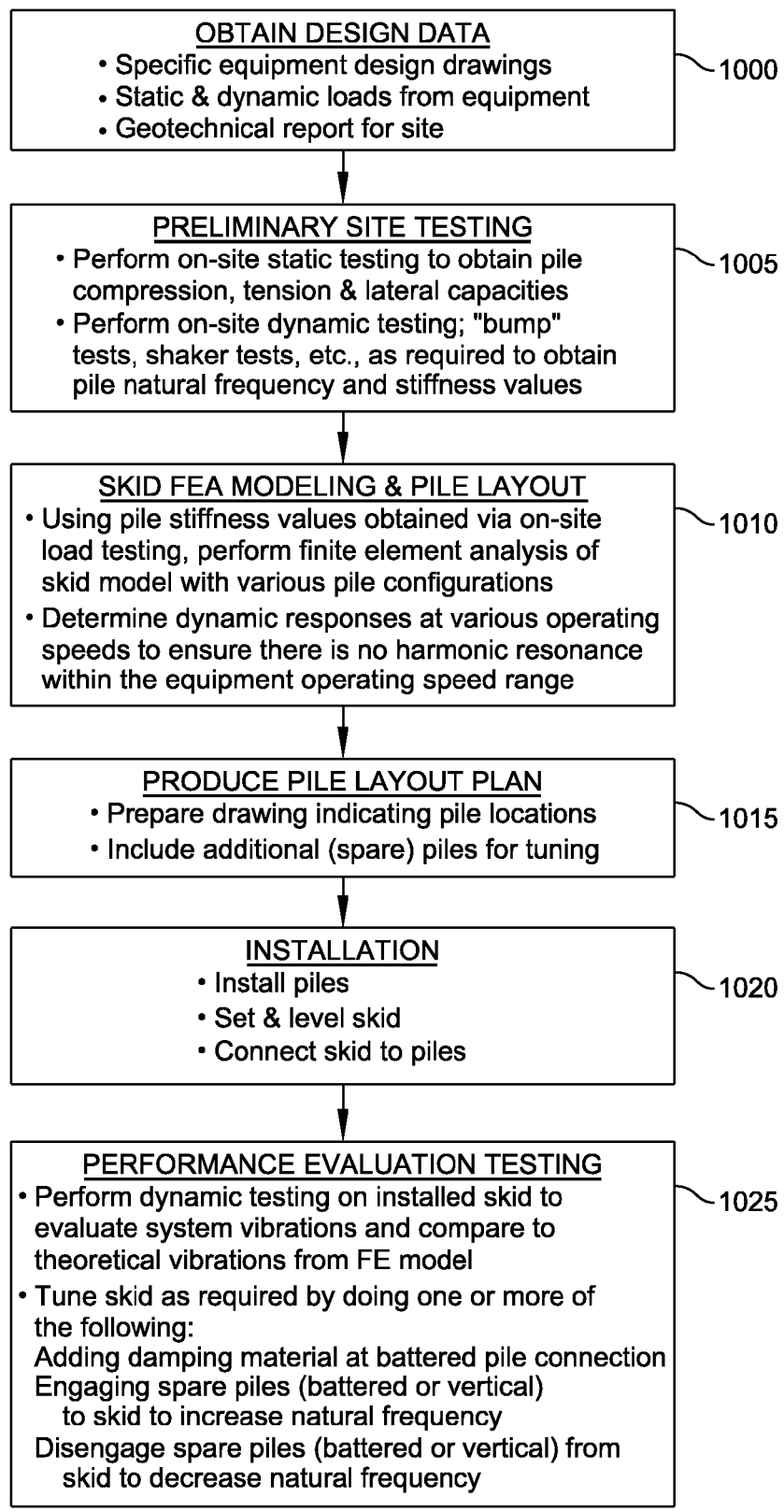
FIG. 10 illustrates an example of a dynamic design process, in accordance with one embodiment.

FIG. 10 illustrates an example of a dynamic process for designing foundation systems, in accordance with one embodiment of the present invention. This process can be used to dynamically design and tune the pile members supporting a skid/platform of a foundation system. As described above, the foundation system may include a skid/platform for supporting a load (i.e., structure and/or equipment such as heavy reciprocating equipment), and a plurality of vertical piles, angled piles, and tunable piles.

In one exemplary embodiment, the process can include preliminary on-site vibration testing (i.e., shaker testing) that provides pile stiffness values once the piles have been driven into the ground; modal testing (i.e., bump tests) to determine the natural frequency of piles; static testing to verify soil density; skid/platform modeling using Finite Element Analysis (FEA) to determine the natural frequency of the skid. In an exemplary embodiment, field and pile results are input into the FEA model which is simulated to determine if a harmonic resonance would occur within the operating speed range of the heavy reciprocating equipment that is to be supported by the foundation system. If yes, then piles can be added, removed or relocated until the simulation results are acceptable in terms of minimizing vibration/resonance. Once the model simulation is confirmed as acceptable, then the pile layout plans are created and depending on the layout design plans, the plans may use of vertical piles, battered piles, and tunable piles. The piles are then installed into the ground according to the pile layout plans. Once the piles are installed into the ground and their position, height, level and any other parameters are confirmed, the skid is lowered onto the piles, the foundation is leveled, and the piles are welded to the skid. If needed, shims (as described below) can be used to bridge any gaps between the tops of any piles and the bottom of the skid, wherein the shim is positioned around the outer diameter of the top of the pile and welded to both the pile and the bottom of the skid. Also, if needed, jack bolts can be attached to the top portions of pile members, wherein the jack bolts are adjusted to raise the level of the skid at the location of the pile, in order to help level the foundation if needed. Once the skid has been leveled and connected (i.e., welded or otherwise joined) with the pile members, before startup of the equipment, the skid is vibration tested with shakers and sensors that are placed on the skid, to confirm there are no unacceptable levels of harmonic resonance/vibration within the operating speed of the equipment; and if there is, one or more piles are adjusted, e.g., dampened or stiffened to adjust outside of the natural frequency of vibration. For instance, one or more tunable pile members can be dampened, which can help reduce vibration of the foundation. Once the vibration testing confirms that there are no unacceptable levels of harmonic resonance/vibration within the operating speed of the equipment, the equipment on the skid is turned on. Additional fine-tuning adjustments to the tunable piles can be made if desired.

FIG. 10 shows an exemplary process. At operation 1000, design parameters such as the skid/platform size, site characteristics, and deflection tolerances are gathered.

At operation 1005, on-site testing is performed which may include testing of soil characteristics, static load testing of vertical piles, determination of the natural frequency of a pile once it has been installed into the ground (i.e., modal testing through hitting the pile with an object and measuring its response), vibration testing, or both. Vibration testing may include measuring the response (i.e., frequency response) of one or more vertical piles to agitation at different frequencies, wherein such agitation can be created through an electromechanical device (shaker) which vibrates at desired test frequencies and intensities and the response can be measured with sensors connected with a computer. Operation 1005, can be used to obtain the natural frequency of example pile members after they have been installed into the ground at the site, as well as stiffness values.

Figure 18:
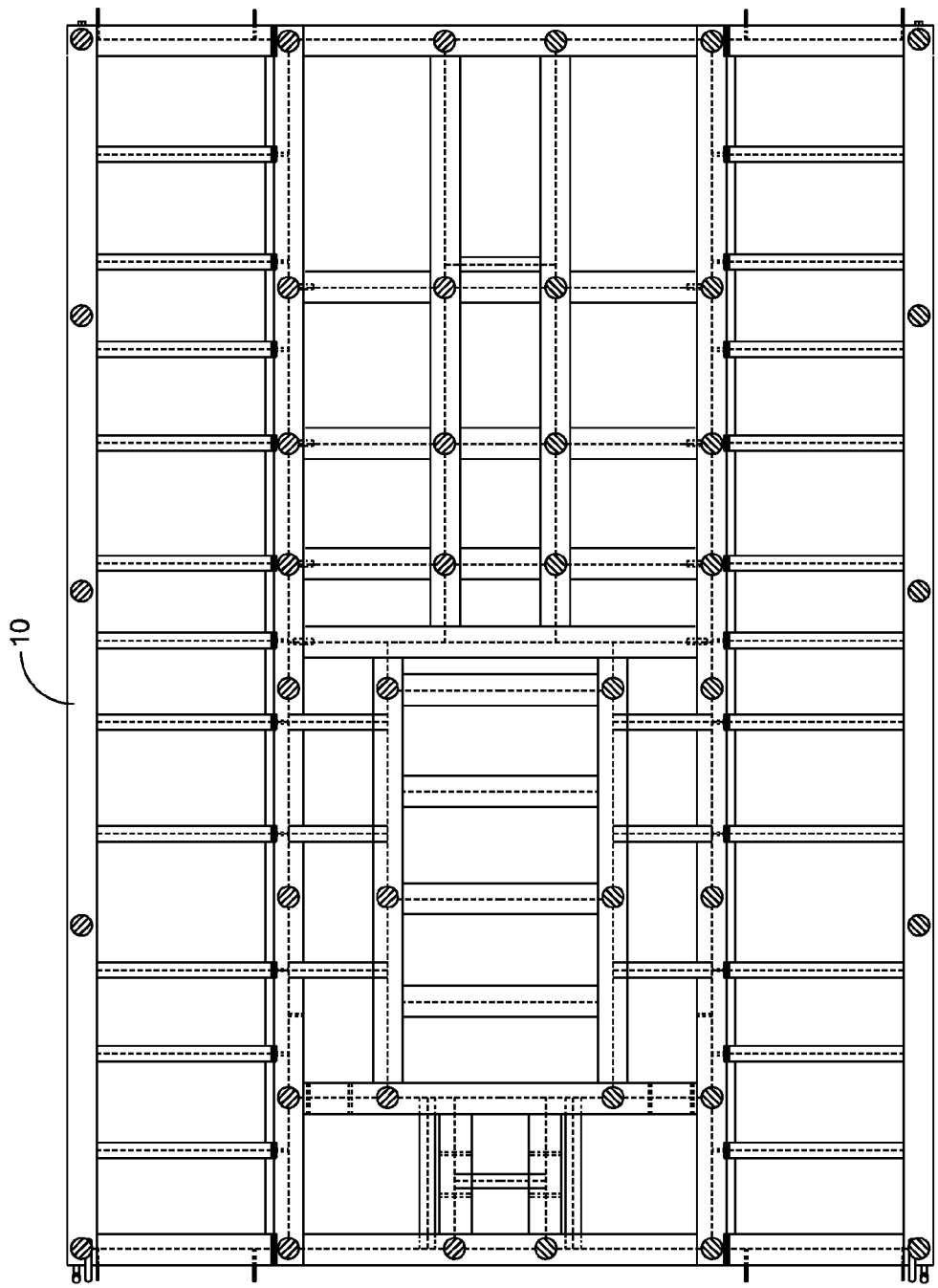
FIG. 18 illustrates an example of a pile layout design for supporting a skid, in accordance with one embodiment.

At operations 1010 and 1015, based upon the information obtained from the on-site testing and other design parameters and characteristics, a design for the pile foundation is created (see, for example, of FIG. 18). The design is made so as to structurally support the intended load that will be on the skid platform, as well as to satisfy other design criteria such as maximum deflection, wind resistance, etc. The design will vary depending upon the particular implementation, and may include a plurality of vertical piles, angled piles, and tunable piles distributed and secured and into the ground for supporting the skid platform. The design can be made account for reducing or eliminating harmonic resonance that would result from equipment operating at its expected frequency. Finite Element Analysis (FEA) can be used with a computer model of the skid to test different configurations, designs and layouts of pile members. For each design that is modeled, the dynamic response can be modeled or tested at various operating speeds within the expected operating range of the equipment that will be supported by the foundation structure. In the foundation system plan and design that is created by operations 1010 and 1015, the layout of the pile members also includes tunable pile members, so that once installed, the foundation system can be adjusted and tuned as described herein.

At operation 1020, the piles (i.e., vertical pile members, tunable pile members) are installed into the ground according to the plan, and the platform is attached to the piles. In one embodiment, the tunable piles may be initially installed in an open configuration with no tunable insert portions. The skid (which may include, but is not limited to, the equipment and/or other structures) is leveled, and installed and welded onto the piles. As described herein, jack bolts can be attached to the pile members to help in leveling the skid, and shim tubes can be welded between the top of a pile member and the bottom of the skid, if needed.

Figure 19:
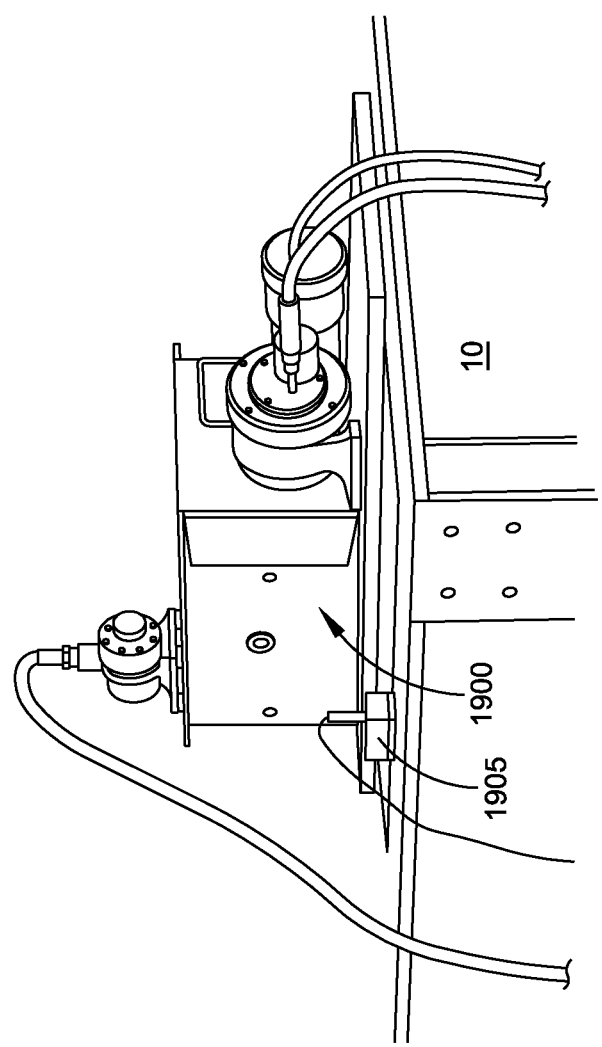
FIGS. 19 and 20 illustrate examples of a shaker placed on a skid, in accordance with one embodiment.
Figure 20:
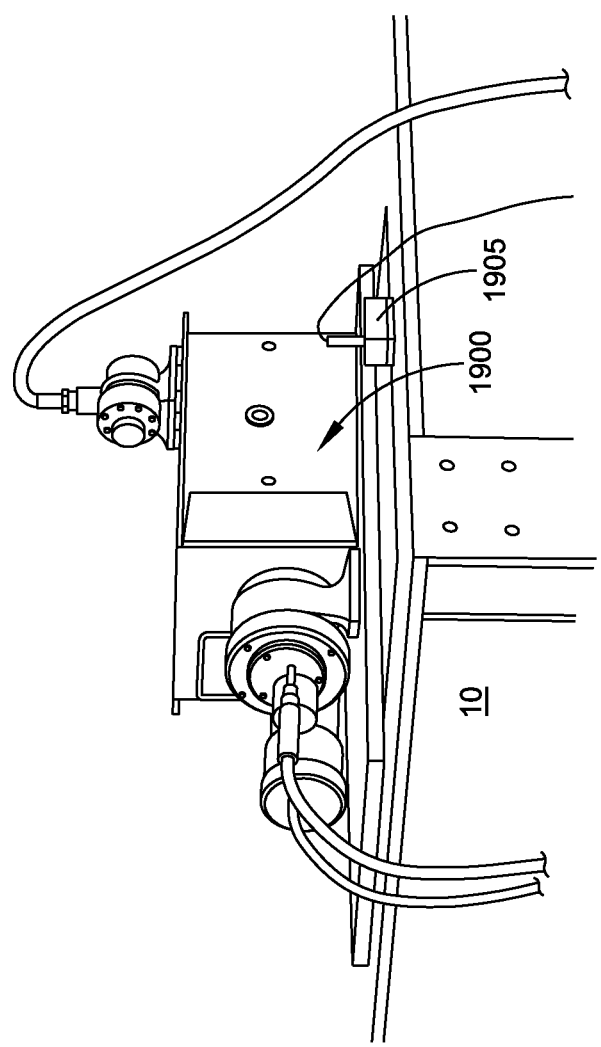
Figure 21:
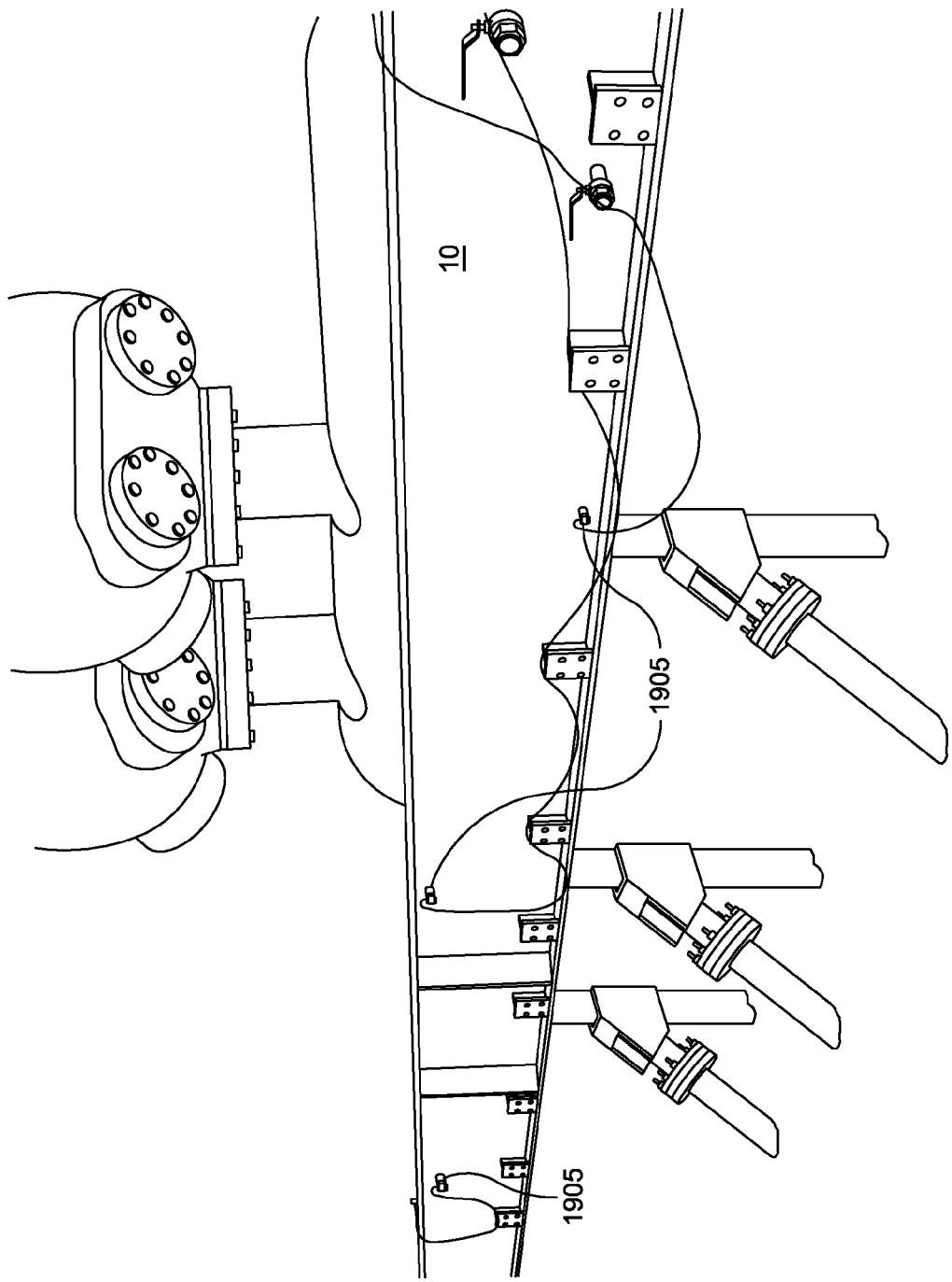
FIG. 21 illustrates an example of sensors placed at various locations on a skid, in accordance with one embodiment.

At operation 1025, vibration tests may be performed on the platform (see, for example, FIGS. 19 and 20 where the shaker 1900 is located on the skid 10, and FIG. 21 where vibration sensors 1905 are connected to the skid at various locations). The platform may be intentionally vibrated by electromechanical devices (i.e., shakers) so as to simulate the vibration that will occur during normal operation of the equipment on the skid. The resulting vibrations of the skid platform may be measured using sensors at various points along the skid platform. The sensors may be connected to a computer or other device(s) that can collect and analyze the vibration data. The foundation system is adjusted or tuned as needed based upon the results from the tests, to reduce or eliminate vibration/harmonic resonance. In one example, if more stiffness is needed at or about one or more portions of the platform, then one or more tunable piles may be connected using a solid steel disc tunable insert portions, which add rigidity to the platform.

If vibration dampening is needed at or about one or more portions of the platform, one or more tunable piles may be connected using a vibration dampening materials as the tunable insert portions. This may be configured to reduce or absorb vibrations along the skid platform.

Other adjustments can be made, alone or in combination, such as, but not limited to, adding or removing mass to or from the skid; connecting to the skid spare piles that were installed into the ground; disconnecting piles that are connected to the skid; or any combination of adjustments as described herein.

Operation 1025 may be repeated until the desired amount of dampening or vibration reduction of the platform is achieved.

Having achieved desired dampening or vibration reduction, the actual equipment (i.e., natural gas processing equipment) on the platform can be started up for normal operation. For any remaining vibration issues that are experienced while the equipment is operating, the foundation system may be fine-tuned, for instance using one or more of the techniques described with reference to operation 1025. If any long-term natural frequency change occurs during the life-time of the foundation, the foundation system may be re-tuned as described herein.

Figure 11A:
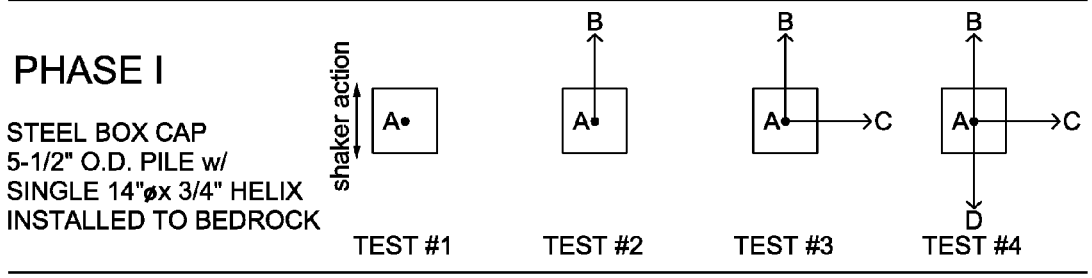
FIGS. 11A(a)-11A(d) and 11B(a)-11B(c) illustrate example tests that can be run as part of the dynamic design process of FIG. 10.
Figure 11A:
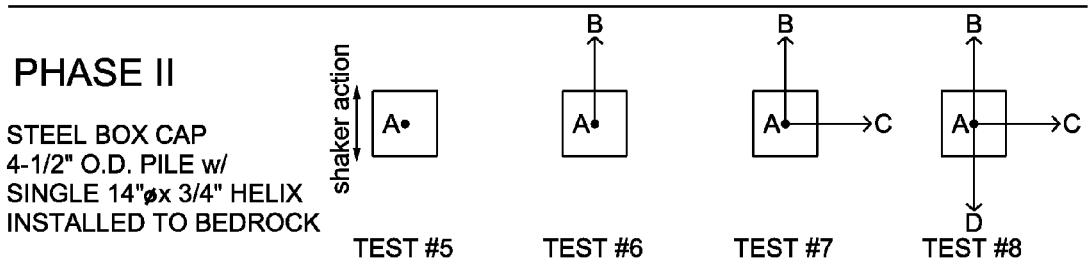
Figure 11A:
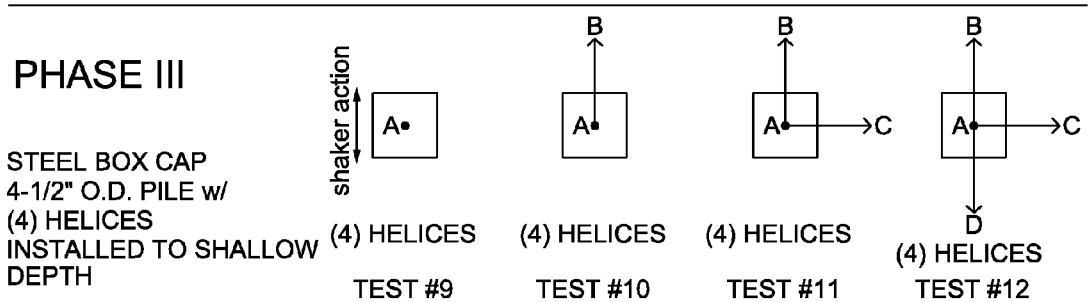
Figure 11A:
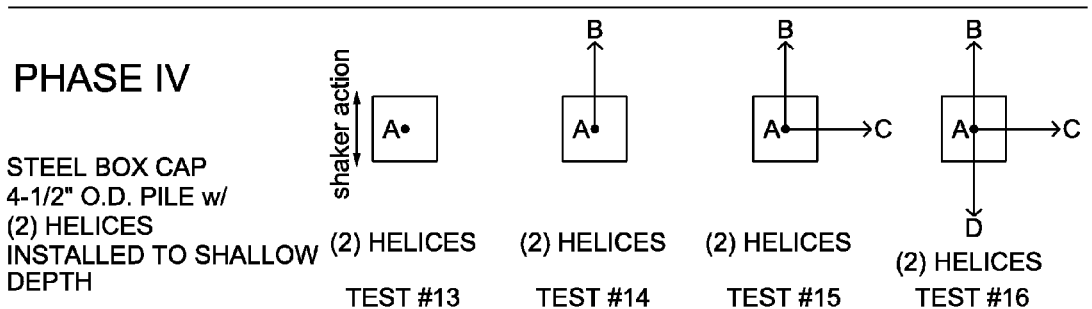
Figure 11B:
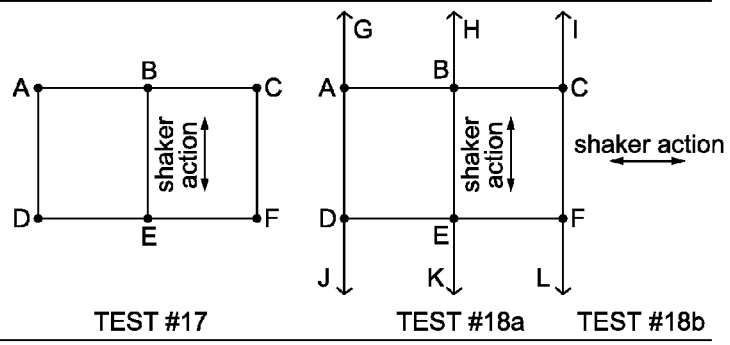
Figure 11B:
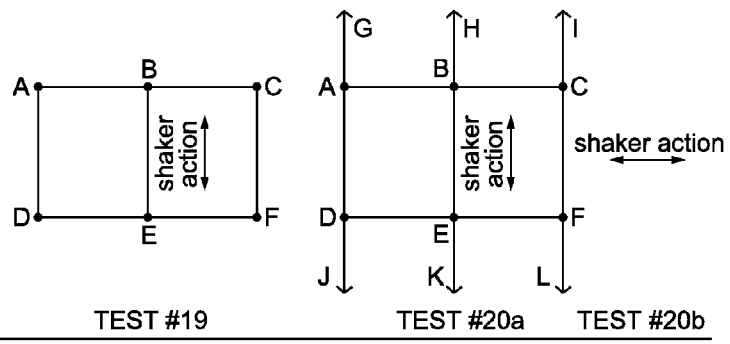
Figure 11B:
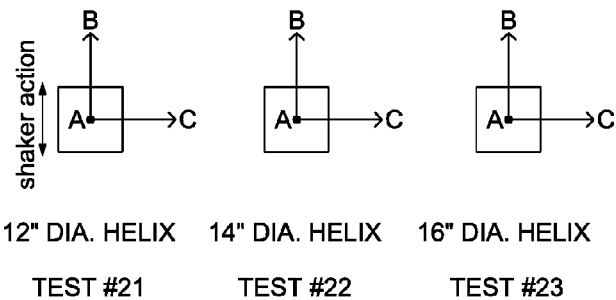

FIGS. 11A and 11B illustrate various types of vibration tests that can be performed to measure vibrational issues in a foundation system as described herein. In FIG. 11, different testing set ups for vibration testing using different pile types, pile orientations and depths of pile are shown. Each vibration test can be used to determine the pile stiffness and natural frequency of that particular test set up. Each vibration test can be used to generate data that can be analyzed for use in the layout and type selection of the piles. For example: For Phase I Test #1, a steel box cap on top of a 5½" diameter pile with a single 14"×¾" helix is installed to bedrock at point A and tested; For Test #2, a battered pile is added at point B and tested; For Test #3, a battered pile is added at point C and tested; For Test #4, a battered pile is added at Point D and tested. Phases II-IV tests can be used with varied diameters, helices and depths of the pile. Phases V-VI tests can be used with a prebuilt box frame with six vertical 4½" diameter piles (A-F) with 14"×¾" helices driven to different depths and tested followed by adding battered piles (G-L) and testing. Phase VII tests can be used wherein 4½" diameter piles can be driven vertically (point A) and battered piles (points B and C) with various helices can be driven to shallow depths and tested. These test setups are provided by way of example only, and do not limit the scope of the embodiments and inventions described herein.

Hence, it can be seen that through the use of tunable pile members and the process described in FIG. 10, a foundation system can be designed, installed, and adjusted/tuned so as to mitigate and control vibration issues as desired. Moreover, through the use of this process, the foundation system is adjustable for vertical and horizontal stiffness whereas traditional systems are not generally adjustable for horizontal stiffness.

Other Components

In the formation of pile foundations, jack bolt systems 1200 (FIG. 12) and shim tubes 1600 (FIG. 16) can also be used to secure and adjust the platform 10 relative to the pile members 15, 20, in accordance with some embodiments described herein. Both shim tubes 1600 and jack bolts 1200 may be used in the dynamic design process for engaging vertical piles when vertical stiffness is required. It should be understood that use of jack bolts and shim tubes is optional, and that the embodiments described above can be used independently or in combination with these components as desired.

Figures 12A, 12B:
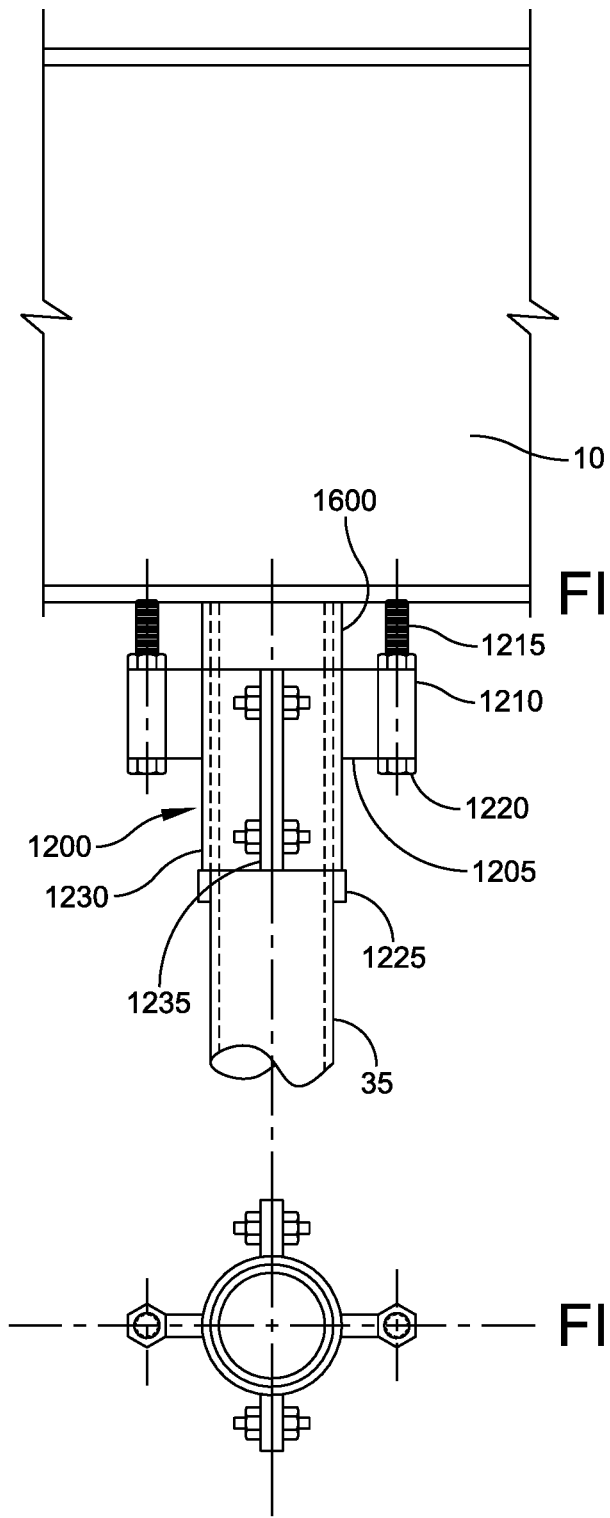

FIGS. 12-14 illustrate examples of jack bolts 1200 for connecting to a pile member in order to engage a portion of a skid platform in order to provide for leveling of the skid platform 10, in accordance with one embodiment.

The jack bolt 1200 is placed about and secured (i.e., welded) about the upper end of pile 15, and when the platform 10 is placed onto the pile 15, the adjustable rod with lock nut of the jack bolt is adjusted upward which puts upward pressure on the platform 10 until the desired level of the platform is obtained. In one example, jack bolts 1200 can be connected to each vertical pile member 15 for engaging each pile member 15 to the skid platform 10, so that precise leveling of the entire foundation structure 5 can be achieved.

When the equipment skid platform 10 is placed on the pile 35 or other type of foundation system 5, the adjustable rod with lock nut of the jack bolt 1200 is adjusted putting upward pressure on the equipment skid 10 until desired level is obtained. A jack bolt 1200 is attached (i.e., welded) to piles or other foundation structures, as required, for equipment skid leveling to allow for precise leveling of the entire skid structure. Additionally, when additional vertical stiffness is needed through the engagement of non-engaged piles, a jack bolt 1200 can be used to pre-load the pile member by lifting the skid frame prior to use of a shim tube, creating additional stiffness.

The jack bolt 1200 can be setup in at least two manners. In one manner, bar stock spacers 1205 of a jack bolt 1200 may be welded on each side of the pile. The bar stock spacer 1205 includes a coupler nut 1210, a threaded rod 1215 and lock nut 1220 welded to the threaded rod 1215 sized appropriately to lift the equipment skid.

In another manner, push blocks or rings 1225 of jack bolt 1200 are welded onto the pile or other foundation structure. A collar 1230 is bolted above the weld on push block or rings. The complete collar with corresponding threaded attachment holes 1235 are bolted in place. The outside of the collar may include a threaded rod and threaded bolt sized as appropriate to lift desired equipment skid. In an embodiment, hinge tubes 1240 may be provide with a permanent or removable pin 1245.

After installation of the foundation system or upon a determination that additional non-engaged vertical piles need to be engaged to add additional stiffness, the jack bolt 1200 is placed upon the foundation system, for instance, through either setup described above. After the equipment skid is placed and leveling is needed, the jack bolts 1200 are adjusted throughout the foundation system to obtain the precise desired level of the platform/equipment skid. A shim tube 1600 (described below) may then be welded between the pile member and the bottom of the skid, which thereby attached the pile member to the skid; the jack bolt may then be removed from the pile member, if desired.

Figure 15:
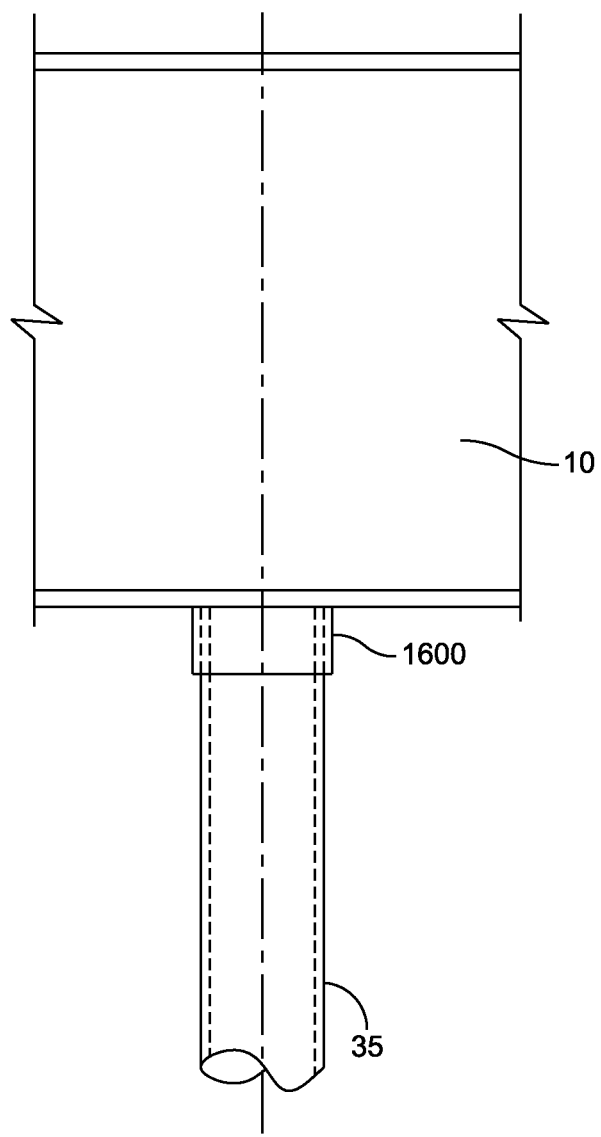
FIGS. 15 and 16(a)-16(d) illustrate examples of shim tubes which may be used for connecting pile members to portions of a platform, in accordance with one embodiment.
Figure 16D:
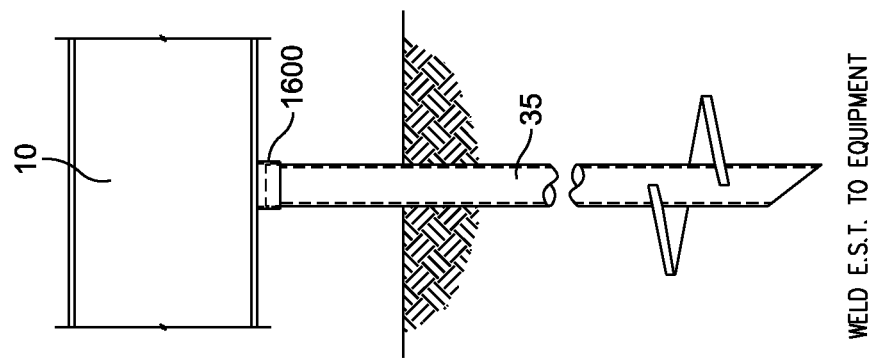
Figure 16C:
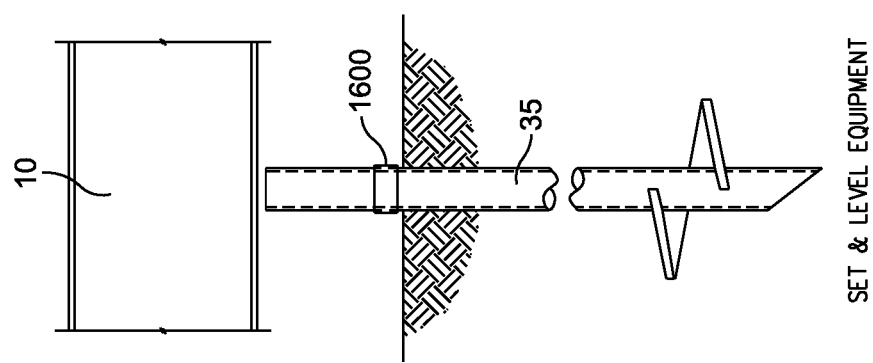
Figure 16B:
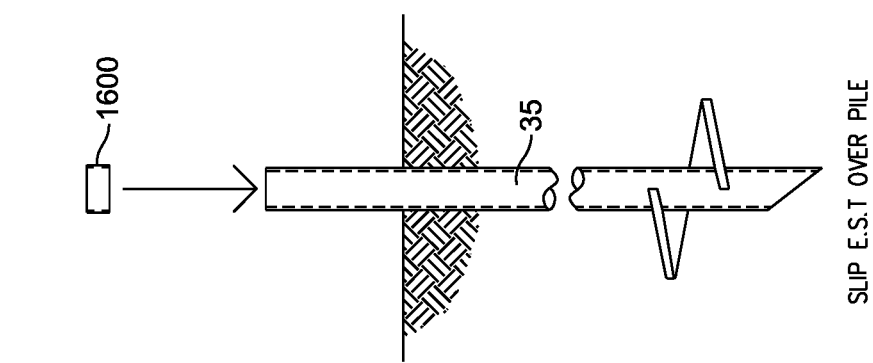
Figure 16A:
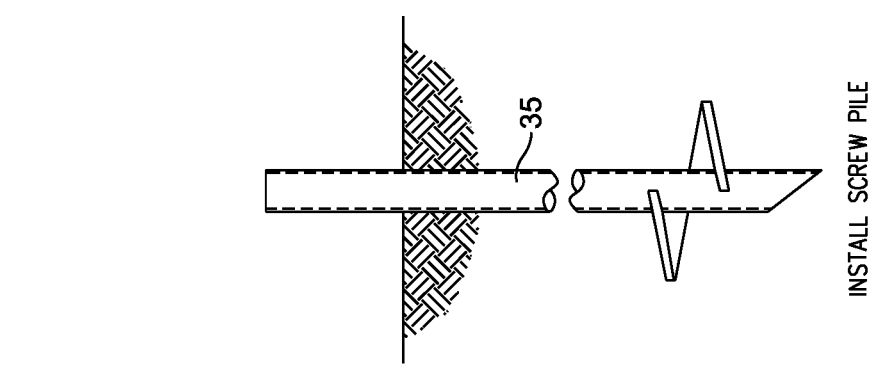

FIGS. 15 and 16 illustrate examples of shim tubes 1600 which may be used for connecting pile members 35 to portions of a platform 10, in accordance with one embodiment. The diameter and thickness of a shim tube 1600 can be adjusted depending on the job application. After installation of the piles in a foundation structure, the shim tube 1600 is placed over all pile shafts within the foundation system prior to placement of the equipment skid or other structures supported by the platform or foundation system. After leveling of the platform skid, on vertical piles to be engaged with the platform, the shim tube 1600 system is raised to compensate for any gaps between the platform skid 10 and the pile shaft 35, and the shim tube is welded in place to both the pile member and to the bottom side of the skid creating support on all engaged pile shafts within the foundation system for the equipment.

Upon a determination that additional vertical stiffness is required, the shim tubes 1600, on pile shafts 35 that have not yet been engaged, are raised to compensate for any gaps between the equipment skid 10 and the pile shaft 35 and welded in place, thereby creating support and additional vertical stiffness by engaging these pile shafts 35 to the skid 10. The use of the shim tubes is a high speed method to engage a pile shaft to the skid without the requirement of use of an inefficient conventional bar stock or other method of shimming. FIG. 16 illustrates the operations of using a shim tube 1600 to connect a pile to the platform skid 10, in accordance with one embodiment.

Through the use of one or more features of embodiments as described herein, various advantages can be realized. For example, a foundation system can be installed in a much shorter time period (i.e., 5 weeks faster) than traditional foundation systems (such as traditional concrete foundation systems 5) for heavy reciprocating equipment 85. In another example, a foundation system 5 made using one or more features of these embodiments is adjustable and tunable for both vertical and horizontal stiffness, wherein a traditional foundation system (i.e., concrete foundation poured and set on the ground) is generally not tunable or adjustable.

In another embodiment, a foundation system made using one or more features of these embodiments can be formed without the need to import concrete and water to the job site. Some job sites where foundations are needed can be in remote locations, thereby adding significant costs for hauling concrete and other materials for the installation of a traditional concrete foundation system. Moreover, concerns with traditional concrete joint issues are alleviated because the examples of the foundation systems disclosed herein do not use such concrete joints.

Where corrosion is a concern, for instance in locations with high humidity or exposure to water, with traditional concrete foundations, this concern is typically addressed by adding more concrete at significantly higher cost. Foundation systems made using one or more features of these embodiments can be formed to address this concern by adding or increasing the wall thicknesses of piles to make the piles more resistant to long term corrosion, without adding significant additional costs to the foundation.

FIG. 22 illustrates an example of a tunable pile member in three different configurations, in accordance with one embodiment.

Figure 23:
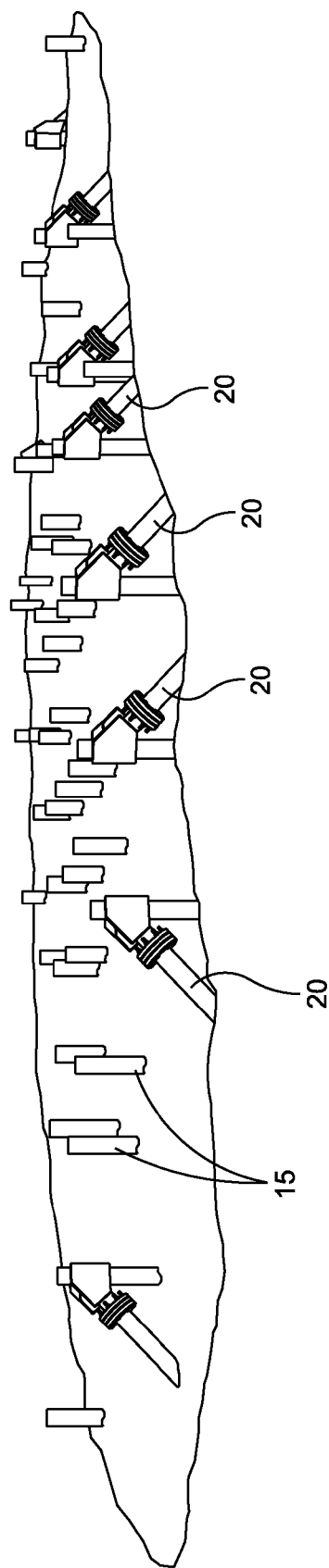
FIGS. 23 and 24 illustrate an example of an installation of tunable pile members prior to installation of a platform.
Figure 24:
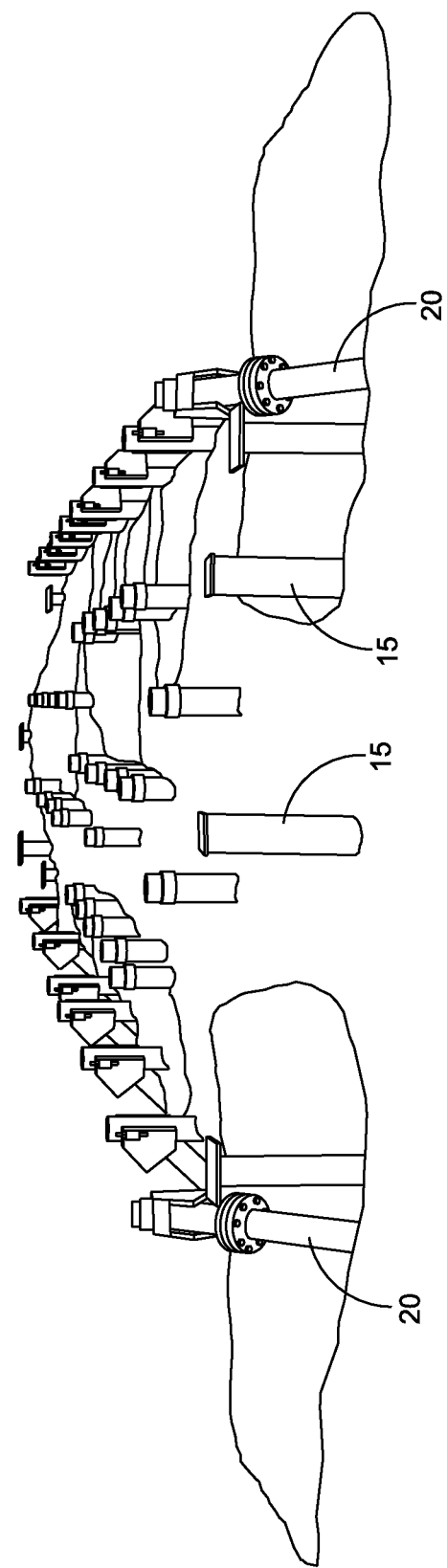

FIGS. 23 and 24 illustrate exemplary installation of tunable pile members 10, 20 prior to installation of a platform.

Figure 25:
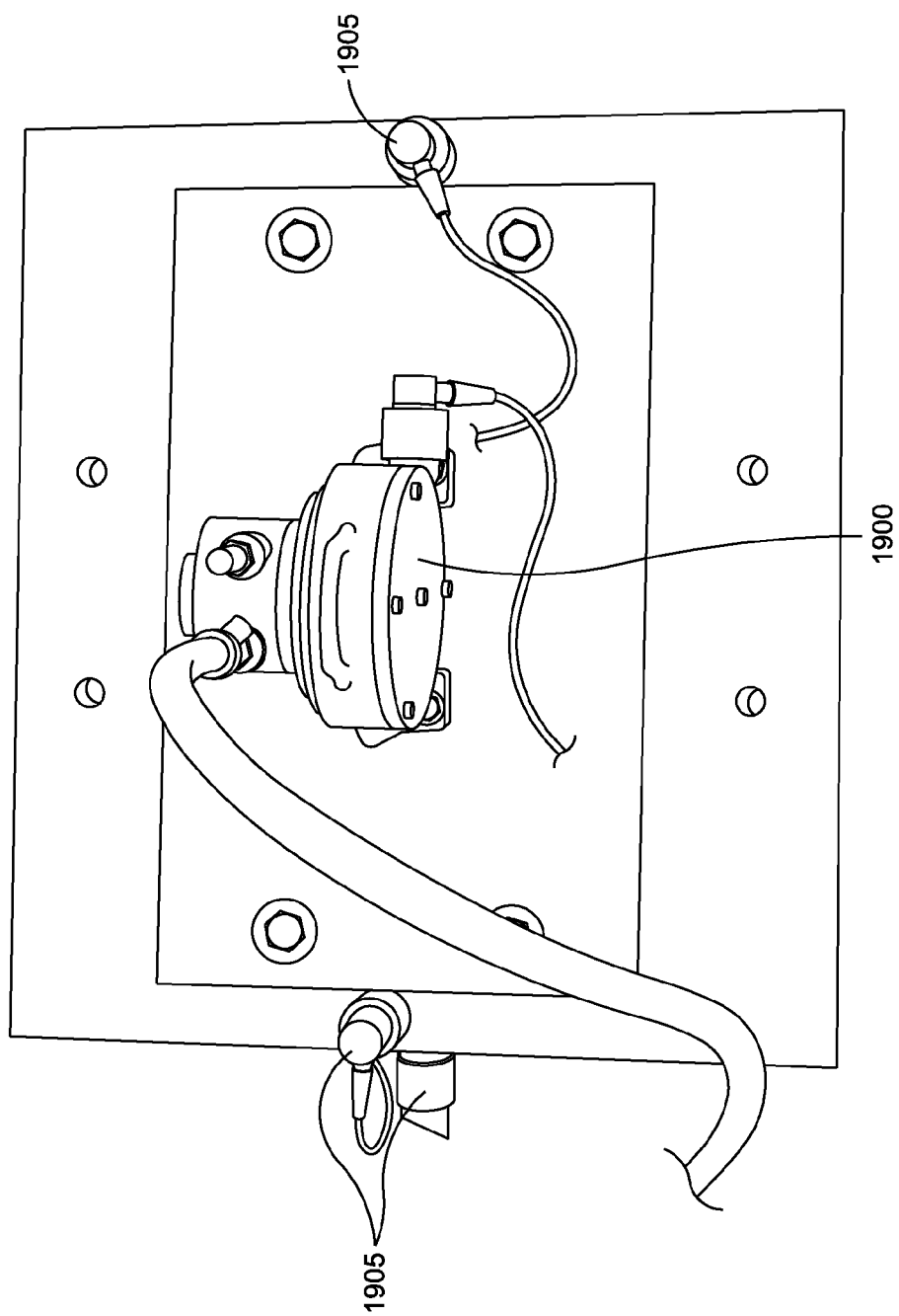
FIG. 25 illustrates a shaker together with a sensor disposed at a single tunable pile member.

FIG. 25 illustrates a shaker 1900 together with sensors 1905 disposed at a single tunable pile member (not shown underneath the shaker 1900.)

Figure 26:
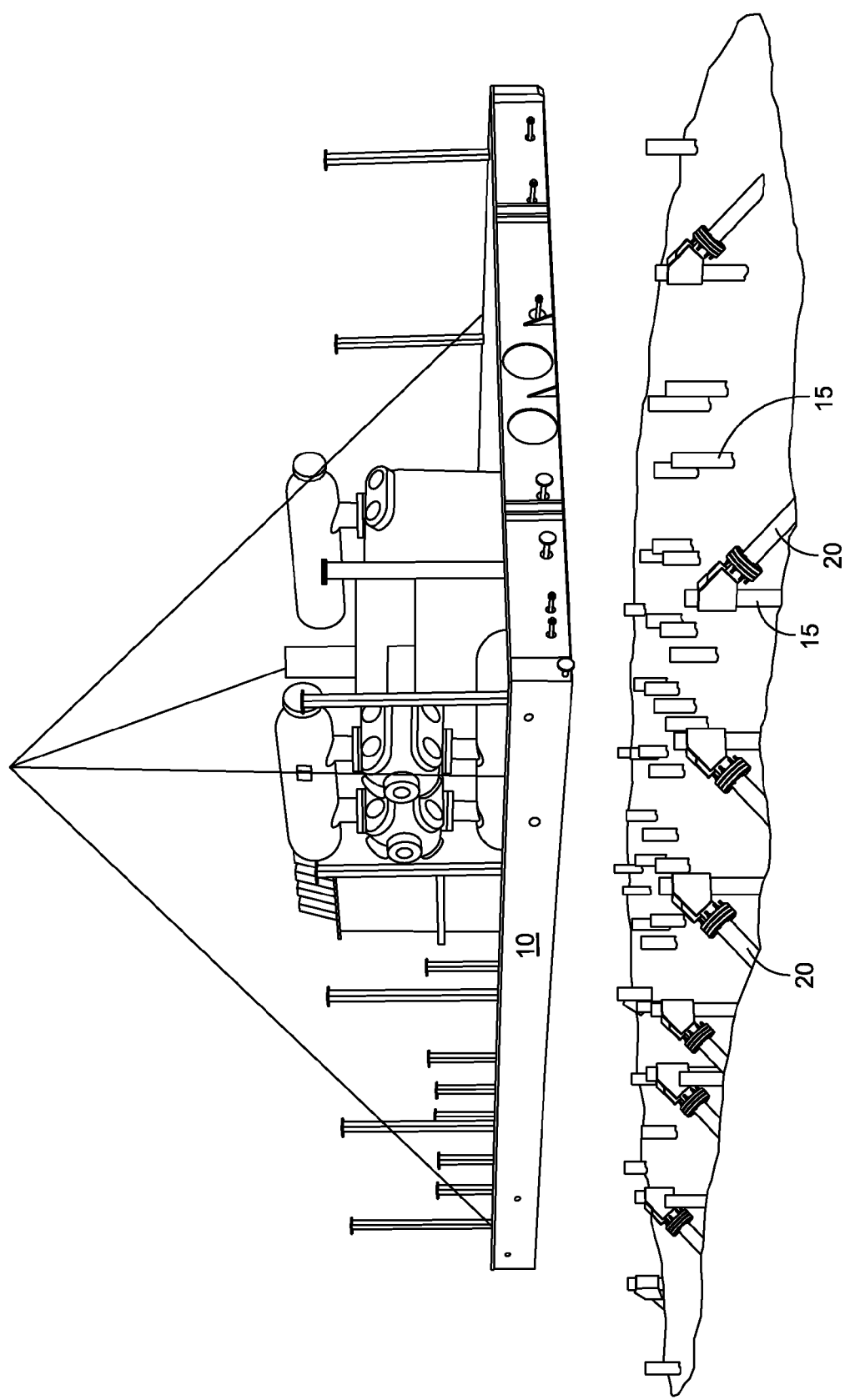
FIG. 26 illustrates a platform during placement onto a plurality of tunable pile members.
Figure 27:
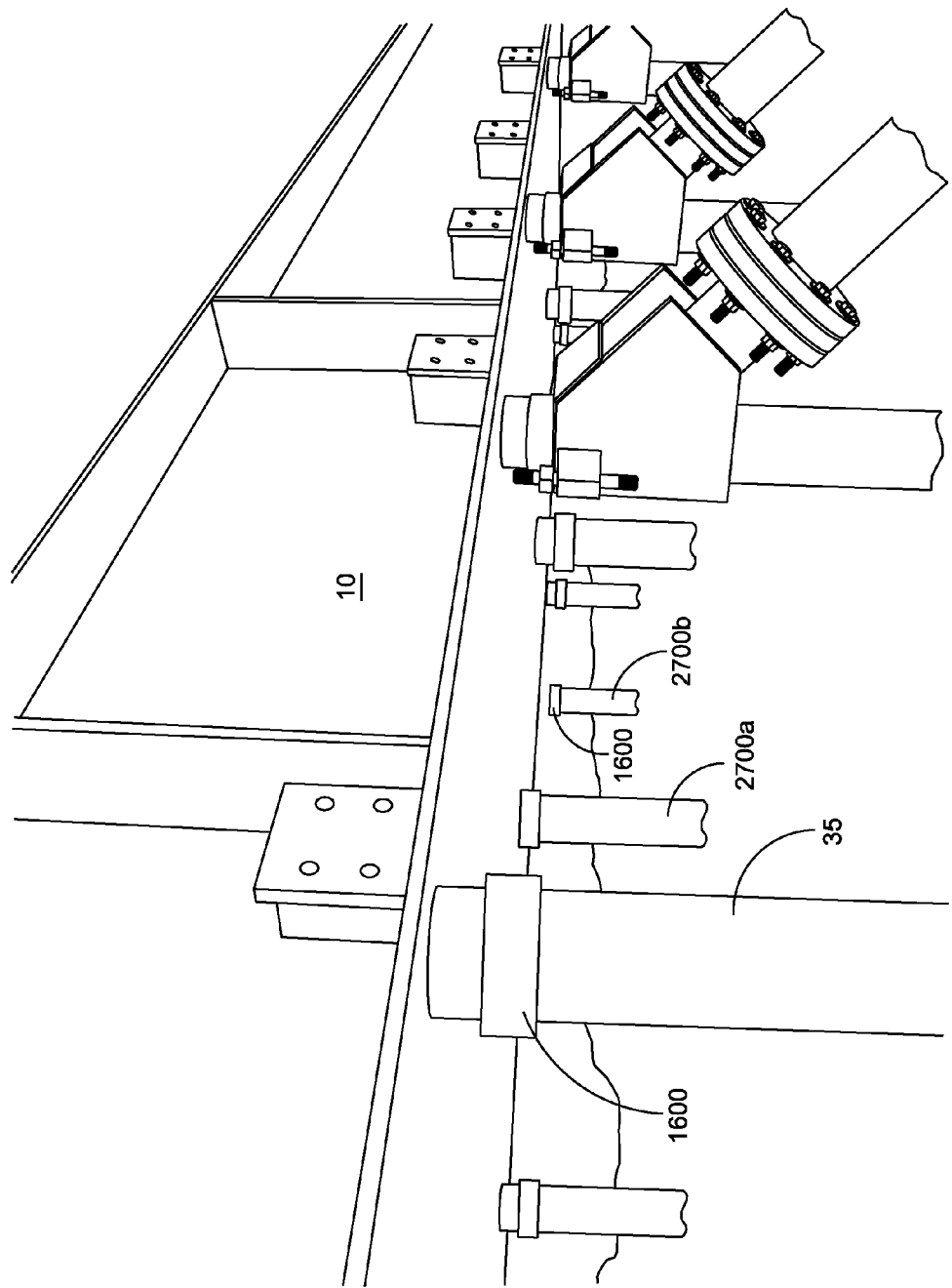
FIG. 27 illustrates the tunable pile members selectively attached to the platform during installation and testing of the required stiffness so as not to excite (and thereby prevent) the natural frequency of the foundation system from harmonically resonating.

FIG. 26 illustrates platform 10 during placement onto a plurality of tunable pile members 15, 20. FIG. 27 illustrates the tunable pile members in various states of connection. Tunable pile member 2700A is illustrated connected to platform 10 with shim tube 1600. Tunable pile member 2700B is disconnected from platform 10 with shim tube 1600 also disconnected from platform 10. Tunable pile members may be selectively attached to the platform 10 during installation and testing of the required stiffness so as not to excite (and thereby prevent) the natural frequency of the foundation system from harmonically resonating. Pile members may be selectively attached or detached from the platform 10, after its placement.

Figure 28:
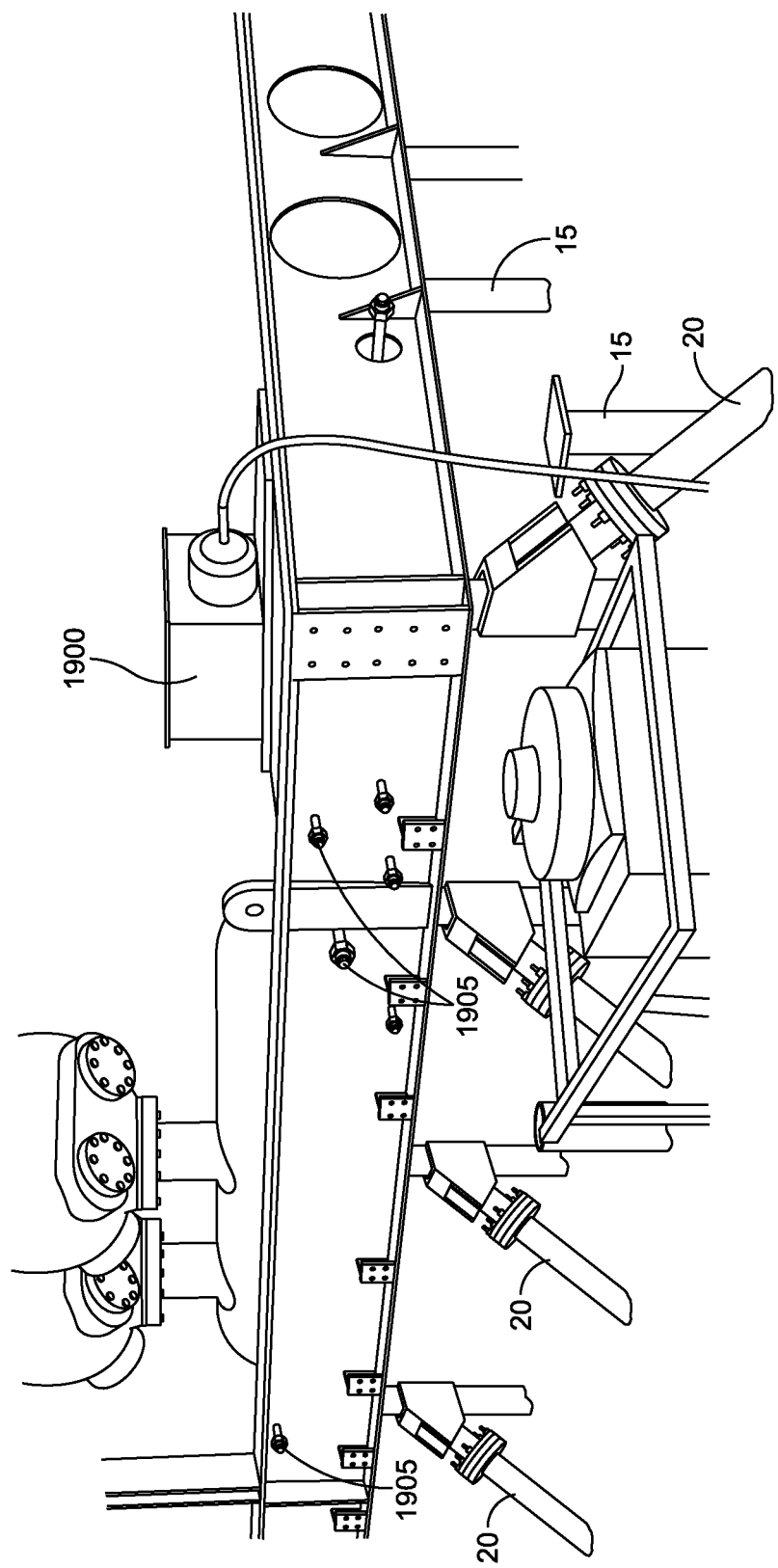
FIG. 28 illustrates a shaker and a sensor disposed on the platform in connection with the foundation system of the tunable pile system during testing of the required stiffness so as not to excite (and thereby prevent) the natural frequency of the foundation system from harmonically resonating.

FIG. 28 illustrates a shaker 1900 and sensors 1905 disposed on the platform 10 in connection with the foundation system of the tunable pile system during testing of the required stiffness so as not to excite (and thereby prevent) the natural frequency of the foundation system from harmonically resonating.

Figure 29:
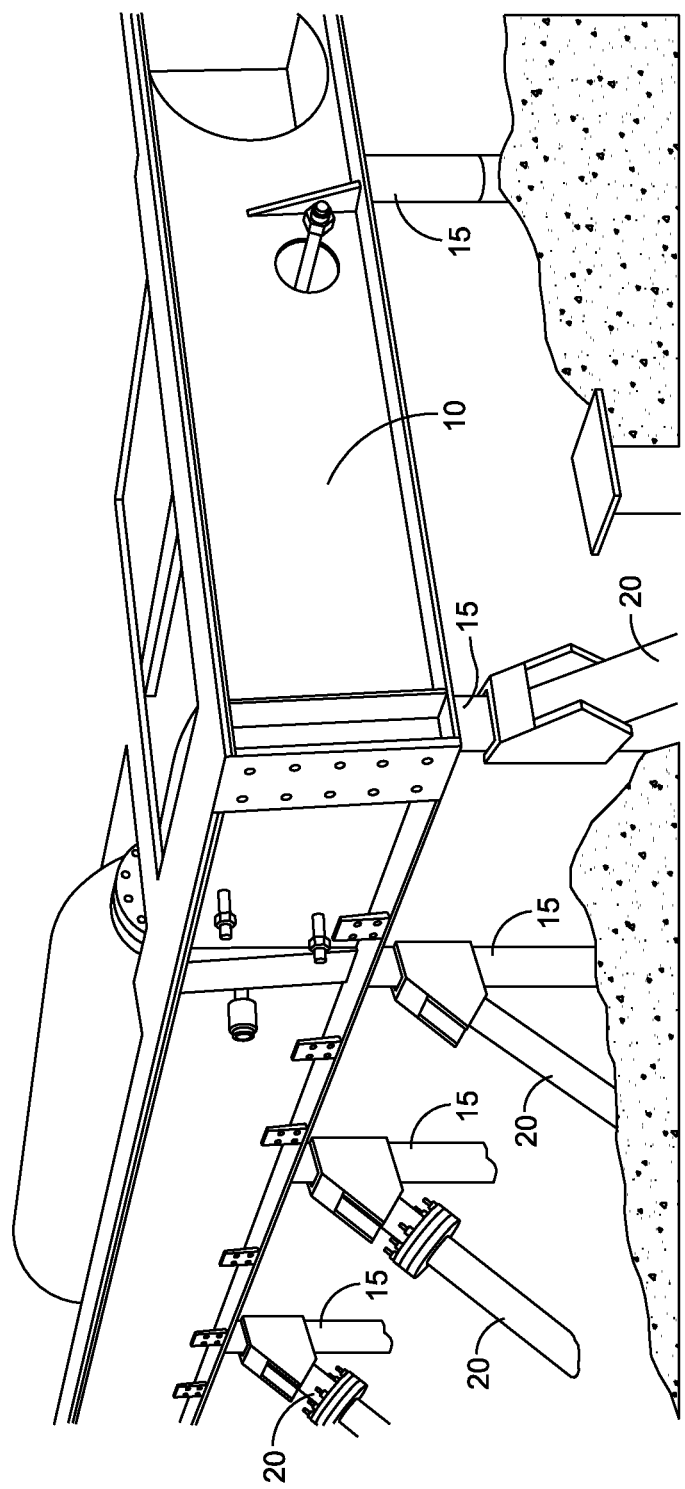
FIG. 29 illustrates the platform installed onto the foundation system of the tunable pile members.

FIG. 29 illustrates the platform 10 installed onto the foundation system of the tunable pile members.

Figure 30:
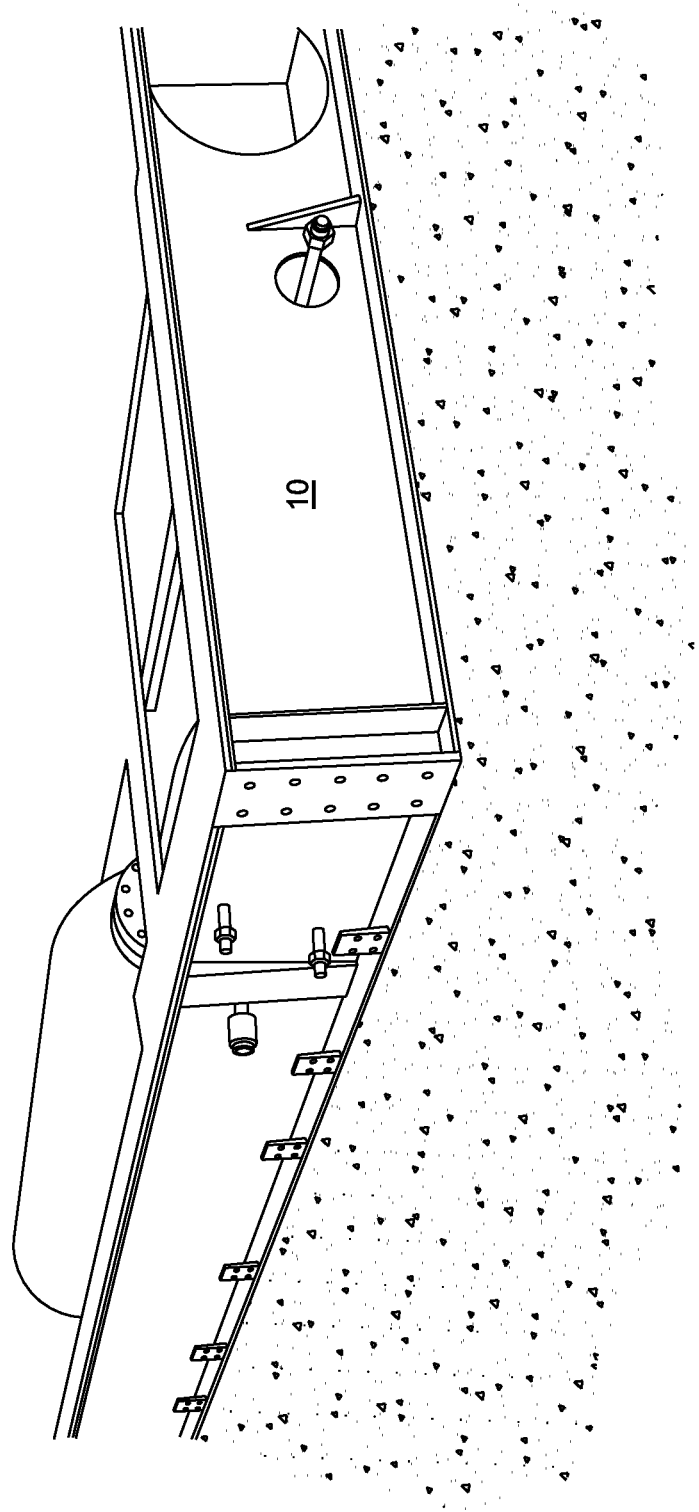
FIG. 30 illustrates the platform of FIG. 29 in which backfill or other material covers the foundation system of the tunable pile members to the edge of the platform.

FIG. 30 illustrates the platform of FIG. 29 in which backfill or other material covers the foundation system of the tunable pile members to the edge of the platform.

Although the above embodiments have been described in language that is specific to certain structures, elements, compositions, and methodological steps, it is to be understood that the technology defined in the appended claims is not necessarily limited to the specific structures, elements, compositions and/or steps described. Rather, the specific aspects and steps are described as forms of implementing the claimed technology. Since many embodiments of the technology can be practiced without departing from the spirit and scope of the invention, the invention resides in the claims hereinafter appended.

What is claimed is:

1. A process for making a foundation system for a platform, the foundation system capable of harmonic resonation at a natural frequency due to movement of the equipment on the platform, including the steps of:
   a) obtaining design data relating to the load and the soil characteristics;
   b) performing one or more modal tests on a pile member installed in the soil to determine the natural frequency of the pile member;
   c) performing one or more vibration tests on a pile member installed in the soil to determine the stiffness of the pile member;
   d) forming a model of the foundation system using the data obtained in steps a)-c), the model including a skid platform, vertical pile members, and adjustable pile members;
   e) testing, in silico, how the model responds to frequencies in a range of the equipment;
   f) adjusting, in silico, the model to satisfy design criteria;
   g) forming, in silico, a plan of a foundation system based on the adjusted model;
   h) installing the foundation system based on the plan;
   i) performing vibration tests on the installed foundation system, and measuring vibration levels; and
   j) adjusting the foundation system to avoid resonance at a natural frequency by one of stiffen vibrations and dampen vibrations.

2. The method of claim 1, further comprising:
   k) operating the equipment and measuring vibration levels; and l) adjusting the foundation system to avoid resonance at a natural frequency by one of stiffen vibrations and dampen vibrations.

3. The method of claim 1, wherein the operation of adjusting the foundation system includes adding a dampening material to one or more of the adjustable pile members.

4. The foundation system of claim 1, wherein the step of j) adjusting includes at least one of reconfiguring one or more of the vertical pile members are configured to selectively connect with the bottom portion of the skid platform and reconfiguring one or more of the tunable pile members to selectively receive an insert member so that the stiffness of the one or more of the tunable pile members can be adjusted to reconfigure the foundation system to a required stiffness so as not to excite and thereby prevent the natural frequency of the foundation system from harmonically resonating.

5. A process for making a foundation system for a platform, the foundation system capable of harmonic resonation at a natural frequency due to movement of the equipment on the platform, including the steps of:
   a) obtaining design data relating to the load and the soil characteristics;
   b) performing one or more modal tests on a pile member installed in the soil to determine the natural frequency of the pile member;
   c) performing one or more vibration tests on a pile member installed in the soil to determine the stiffness of the pile member;
   d) forming a model of the foundation system using the design data, the determined natural frequency of the pile member data, and the determined stiffness of the pile member obtained in steps a)-c), the model including a skid platform, vertical pile members, and adjustable pile members;
   e) testing, in silico, of how the model responds to frequencies in a range of the equipment;
   f) adjusting, in silico, the model to satisfy design criteria;
   h) forming, in silico, a plan of a foundation system based on the adjusted model;
   i) installing the foundation system based on the plan;
   j) performing vibration tests on the installed foundation system, and measuring vibration levels; and
   k) adjusting the foundation system to avoid resonance at a natural frequency by one of stiffen vibrations and dampen vibrations.

6. The process of claim 5, wherein the step of k) adjusting includes at least one of reconfiguring one or more of the vertical pile members to selectively connect with the bottom portion of the skid platform and reconfiguring one or more of the tunable pile members to selectively receive an insert member so that the stiffness of the one or more of the tunable pile members can be adjusted to reconfigure the foundation system to a required stiffness so as not to excite and thereby prevent the natural frequency of the foundation system from harmonically resonating.

\* \* \* \* \*